United States Patent [19]

Benke

[11] Patent Number: 4,680,797
[45] Date of Patent: Jul. 14, 1987

[54] SECURE DIGITAL SPEECH COMMUNICATION

[75] Inventor: George Benke, Bethesda, Md.

[73] Assignee: The United States of America as represented by the Secretary of the Air Force, Washington, D.C.

[21] Appl. No.: 624,567

[22] Filed: Jun. 26, 1984

[51] Int. Cl.$^4$ .............................................. G10L 5/00
[52] U.S. Cl. ....................................... 381/41; 381/36
[58] Field of Search ................................... 381/34–50, 381/29–50; 179/1.5 R, 1.5 G; 375/2.1, 122; 382/56; 455/26; 364/577, 723

[56] References Cited

U.S. PATENT DOCUMENTS

| | | | |
|---|---|---|---|
| 2,959,639 | 11/1960 | Pierce | 381/31 |
| 3,023,277 | 2/1962 | Mathews | 381/31 |
| 3,157,745 | 11/1964 | Maezono | 381/30 |
| 3,243,703 | 3/1966 | Wood | 381/33 |
| 3,349,180 | 10/1967 | Coker | 179/1 |
| 3,493,684 | 2/1970 | Kelly et al. | 179/15.55 |
| 3,527,885 | 9/1970 | Bussgang | 375/122 |
| 3,536,833 | 10/1970 | Guanella | 178/22 |
| 3,621,397 | 11/1971 | Murotani et al. | 381/31 |
| 4,142,071 | 2/1979 | Croisier et al. | 179/15.55 R |
| 4,214,125 | 7/1980 | Mozer et al. | 381/32 |
| 4,310,721 | 1/1982 | Manley et al. | 179/1 SA |
| 4,354,608 | 11/1982 | Watson et al. | 381/32 |
| 4,370,643 | 1/1983 | Kitamura | 381/31 |
| 4,545,065 | 10/1985 | Visser | 381/47 |

OTHER PUBLICATIONS

Jayant, N. S. "Coding Speech at Low Bit Rates", IEEE Spectrum, Aug. 1986 pp. 58–63.

Reddy and Watkins, "Use of Segmentation and Labeling in Analysis-Synthesis of Speech" International Conference on Acoustics, Speech and Signal Processing 1977, IEEE.

Fjällbrant, "A Method of Data Reduction of Sampled Speech Signals" Conference: Eurocon 1977 Proceedings on Communications.

*Primary Examiner*—E. S. Matt Kemeny
*Assistant Examiner*—R. H. Johnson
*Attorney, Agent, or Firm*—Bernard E. Franz; Donald J. Singer

[57] ABSTRACT

A novel form of waveform coding is used, designated a "Critical Point Coder" (CPC). It operates by transmitting only those points in a waveform which are significant for defining its overall structure. The receiver reconstructs the missing points in the waveform using some sort of approximating interpolation. The Critical Point Coder uses a new approach to waveform coding. Rather than transmitting information about each sample as other waveform coders, the Critical Point Coder transmits information for only samples deemed critical to high quality reconstruction. The four major functions performed by the Critical Point Coder are (1) detecting which samples are critical, called critical points e.g. those points in the waveform where it is changing direction most rapidly, generally the peaks and valleys; (2) quantizing the vectors which are formed between successive critical points; (3) dealing with the non-uniform bit rate since critical points do not occur regularly; and (4) reconstructing the waveform between the endpoints of the quantized vectors. For stabilizing the bit rate, stabilization intervals of fixed duration are divided into equal analysis intervals, with logic to select from three modes for quantizing and encoding the vectors during each stabilization interval, depending upon the stepsize.

4 Claims, 42 Drawing Figures

FIGURE 21
FLOW CHART OF TRANSMITTER

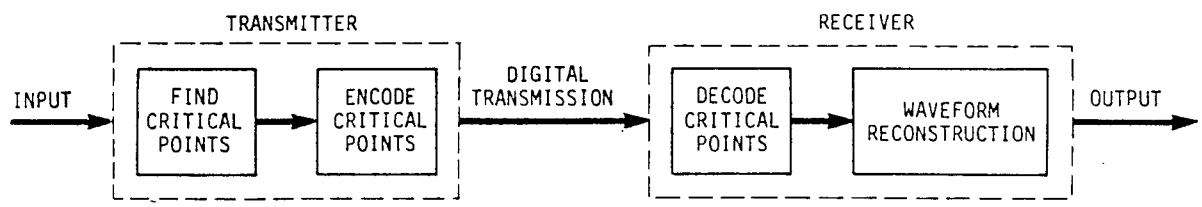
FIGURE 1
BLOCK DIAGRAM OF THE CRITICAL POINT CODER
FIG. IA
ORIGINAL SIGNAL WITH CRITICAL POINTS SHOWN
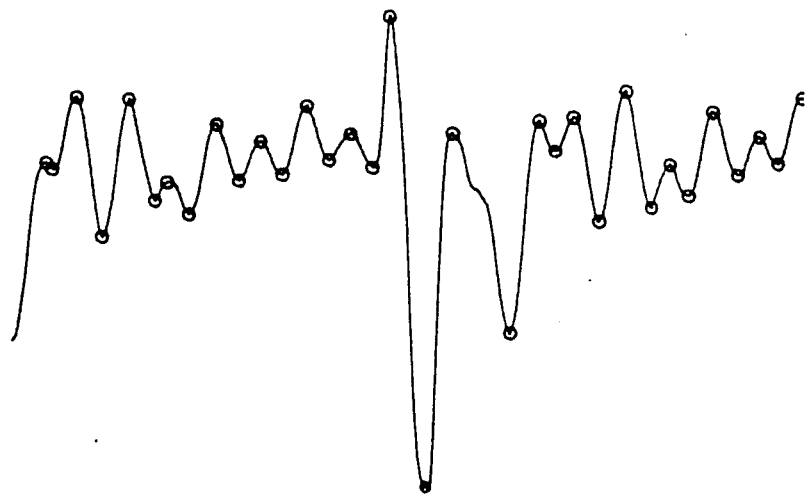
FIG. IB
RECONSTRUCTED SIGNAL

VECTOR QUANTIZATION

ORIGINAL SIGNAL

RECONSTRUCTED SIGNAL

FUNCTIONS OF THE CRITICAL POINT CODER**

EXAMPLE OF CURVATURE CALCULATION**

WAVEFORM

CURVATURE

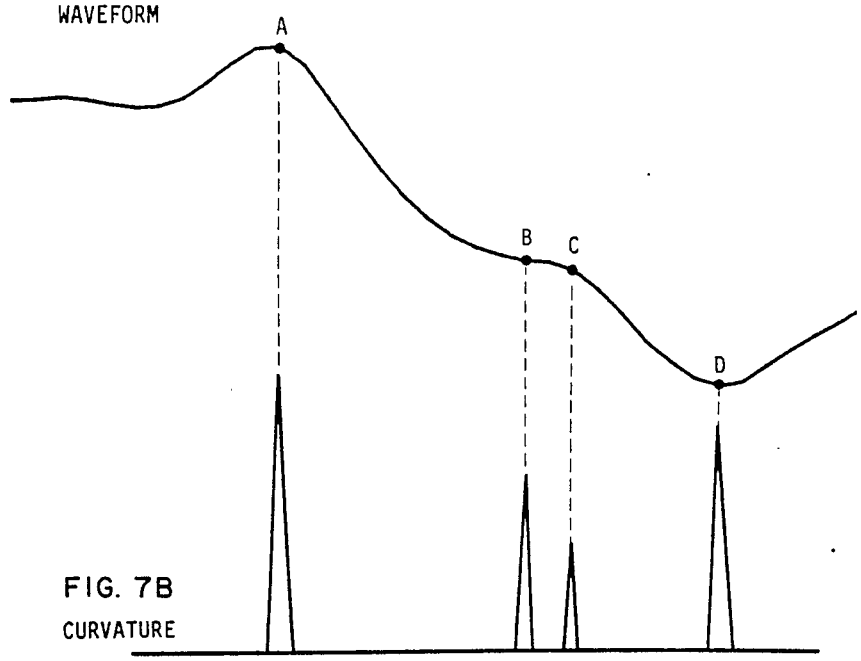
FIG. 7A
WAVEFORM
FIG. 7B
CURVATURE
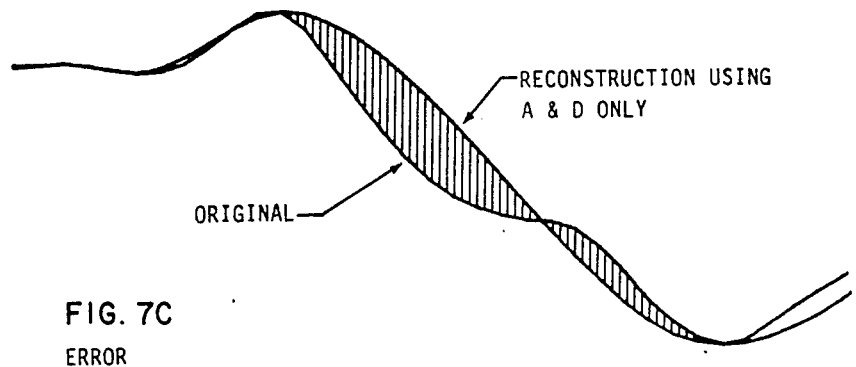
FIG. 7C
ERROR

RELATIVE IMPORTANCE OF CRITICAL POINTS

RELATIONSHIP FOR ADAPTIVE FILTERING SCHEME

ORIGINAL

FILTERED

RECONSTRUCTION

ORIGINAL

FILTERED

RECONSTRUCTION

USE OF ONE CUBIC

USE OF TWO CUBICS

COMPRESSION FUNCTION FOR REDUCING VARIABILITY OF VECTORS

FIG. 14A
ORIGINAL AND RECONSTRUCTED WAVEFORMS
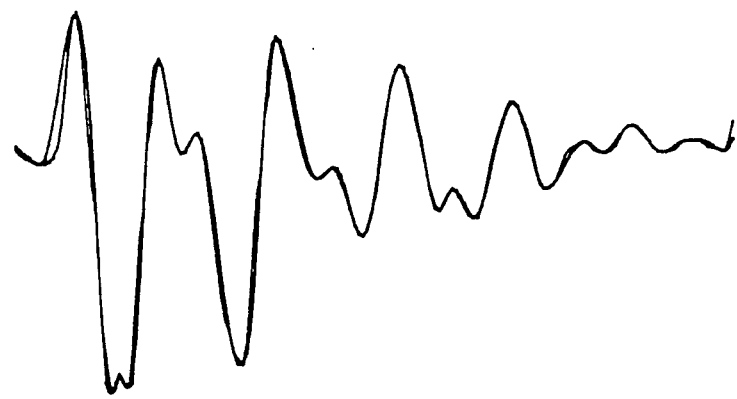
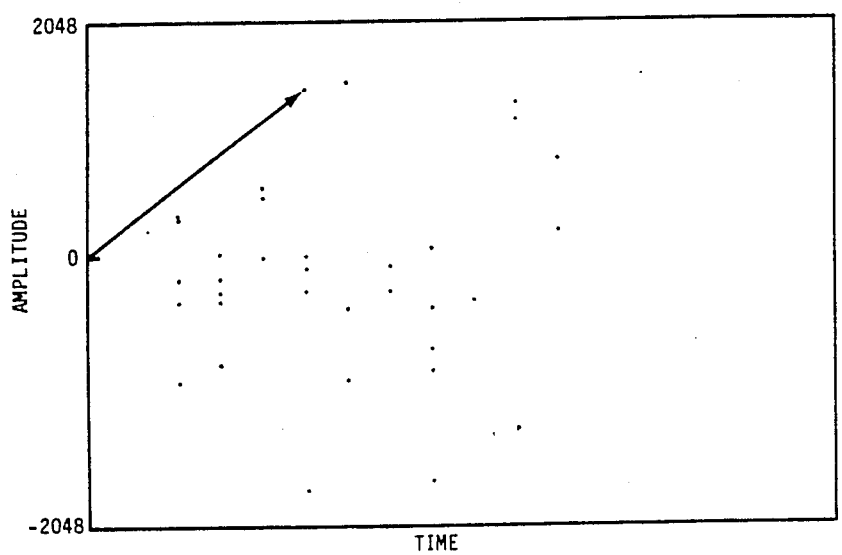
FIG. 14B
VECTOR DISTRIBUTION FIG. 15A
ORIGINAL AND RECONSTRUCTED WAVEFORMS
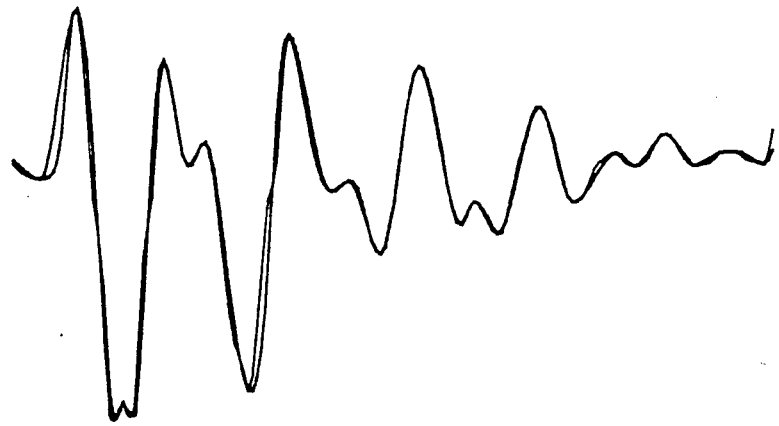
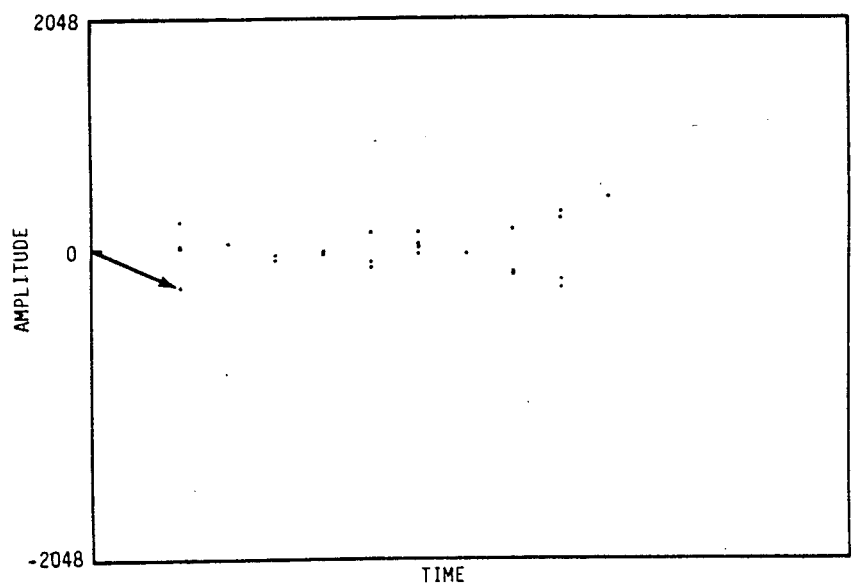
FIG. 15B
COMPANDED VECTOR DISTRIBUTION

DISTRIBUTION OF VECTORS AS A FUNCTION OF
NUMBER OF VECTORS VERSUS ENERGY CONTENT

VARIABILITY IN THE DISTRIBUTION OF
VECTORS DURING VOICED SPEECH

QUANTIZED VECTOR TABLE ADAPTATION

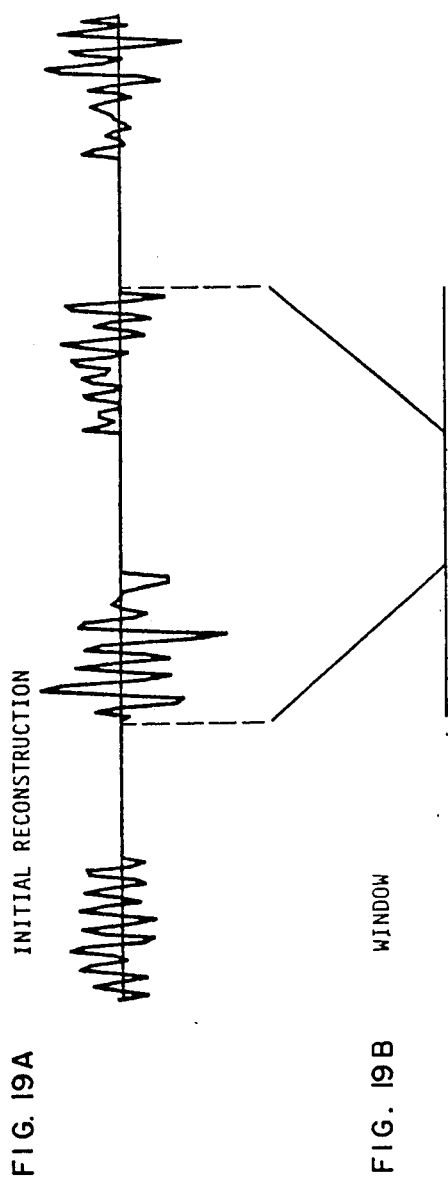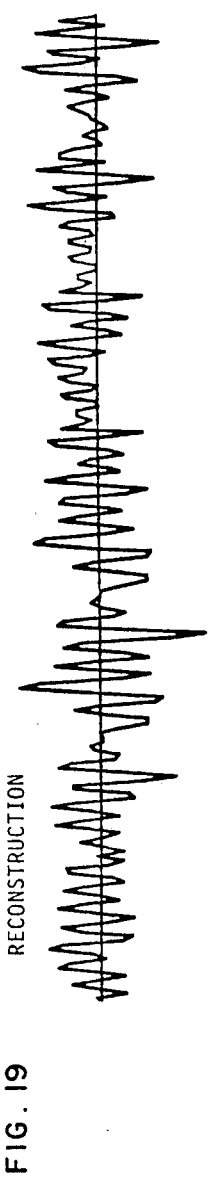
FIG. 19A  INITIAL RECONSTRUCTION
FIG. 19B  WINDOW
FIG. 19  RECONSTRUCTION

CUBIC SPLINING

THIRD ORDER POLYNOMIALS

STATISTICS OF EXAMPLE SPEECH SIGNAL

WHERE M IS THE NUMBER OF
ANALYSIS INTERVALS

FLOW CHART OF TRANSMITTER

EXAMPLE INPUT SPEECH SIGNAL
(96 MSEC)

OUTPUT OF COMPRESSOR AND ADAPTIVE FILTER

BLOCK DIAGRAM OF RECEIVER

BIT STREAM FORMAT FOR MODE 1

BIT STREAM FORMAT FOR MODE 2 AND MODE 3

SECURE DIGITAL SPEECH COMMUNICATION

RIGHTS OF THE GOVERNMENT

The invention described herein may be manufactured and used by or for the Government of the United States for all governmental purposes without the payment of any royalty.

BACKGROUND OF THE INVENTION

This invention relates to a secure digital speech communication system, and more particularly to waveform coding with digital samples.

Known digital voice communication systems described in U.S. patents include U.S. Pat. No. 3,349,180 to Coker, which discloses a system for compressing or reducing the amount of bandwidth employed in the transmission of speech information. It involves the transmission of speech information in terms of narrow bandwidth control signals representative of the frequency locations of selected peaks in the speech amplitude spectrum. Kelly et al in U.S. Pat. No. 3,493,684 disclose a vocoder of the narrow band type in which short-time analysis is performed on a speech wave to determine its significant characteristics. Manley et al in U.S. Pat. No. 4,310,721 disclose a system in which analog speech is sampled, converted digitally, and then fed into a fast Fourier transform processor. Croisier et al in U.S. Pat. No. 4,142,071 teach quantizing in a channel bandwith conserving arrangement, and Guanella in U.S. Pat. No. 3,536,833 discloses secret pulse-code speech transmission.

High quality secure voice systems are, and will continue to be, an important part of effective military communication. Achieving high quality is important for voice recognition, interoperability among user communities, and user acceptance of a secure voice system. User acceptance of secure voice equipment is of paramount importance in maintaining the overall security in a communications system. Acceptance or rejection of a system is primarily based on factors such as intelligibility, voice recognition, and robustness with respect to channel errors and background noise. These are the properties which are present in "high quality" voice algorithms. On the other hand, achieving reasonably low bit rates is important for reducing bandwidth requirements. The advantages gained from narrower bandwidths include lower transmission costs and the ability to incorporate error correcting or antijamming facilities. Achieving high quality at reasonable low bit rates (9.6–16 kilobits per second) requires an increase in terminal complexity. However, the rapid advances in Large Scale Integration technology will allow more complex algorithms to be implemented on a single chip, thereby keeping costs low.

There are two broad classes of coders used to encode speech digitally: waveform coders and parametric coders. Waveform coders are concerned with preserving the wave shape of the speech signal; therefore, they are somewhat signal independent. This implies that they tend to be robust for a wide range of speaker characteristics and noise backgrounds. Waveform coders usually operate at a medium to high transmission rate in order to achieve good quality. By contrast, parametric coders use a priori knowledge about the source of the signal in order to reproduce the waveform. By adjusting these parameters as the sgnal changes, it can reproduce the speech signal. Parametric coders can operate at rather low transmission rates but tend to be speaker dependent and also lead to unnatural speech quality.

SUMMARY OF THE INVENTION

An objective of the invention is to maximize voice quality while maintaining an operating rate of 16 kilobits per second or less. Simplicity is another object so that final implementation using microprocessors is possible. Another major objective is achieving robustness with respect to background noise, transmission bit errors, and interoperability, i.e., tandem performance.

According to the invention, a novel form of waveform coding is used, designated a "Critical Point Coder" (CPC). It operates by transmitting only those points in a waveform which are significant for defining its overall structure. The receiver reconstructs the missing points in the waveform using some sort of approximating interpolation.

The Critical Point Coder uses a new approach to waveform coding. Rather than transmitting information about each sample as other waveform coders, the Critical Point Coder transmits information for only samples deemed critical to high quality reconstruction. The four major functions performed by the Critical Point Coder are (1) detecting which samples are critical, called critical points; (2) quantizing the vectors which are formed between successive critical points; (3) dealing with the non-uniform bit rate since critical points do not occur regularly; and (4) reconstructing the waveform between the endpoints of the quantized vectors.

BRIEF DESCRIPTION OF THE DRAWING

FIG. 1 is a block diagram of the critical point coder;

FIGS. 1A and 1B are graphs of signal amplitude versus time, which show the basic concept of the critical point coder;

FIGS. 7A, 7B and 7C are graphs showing critical points defined by local extrema;

FIGS. 14A and 14B are graphs of critical point reconstruction without companding;

FIGS. 15A and 15B are graphs showing the effect of companding on critical point coding;

FIGS. 19A, 19B and 19C are graphs showing reconstruction of unvoiced speech;

DETAILED DESCRIPTION

1.0 Introduction

Figure 2:
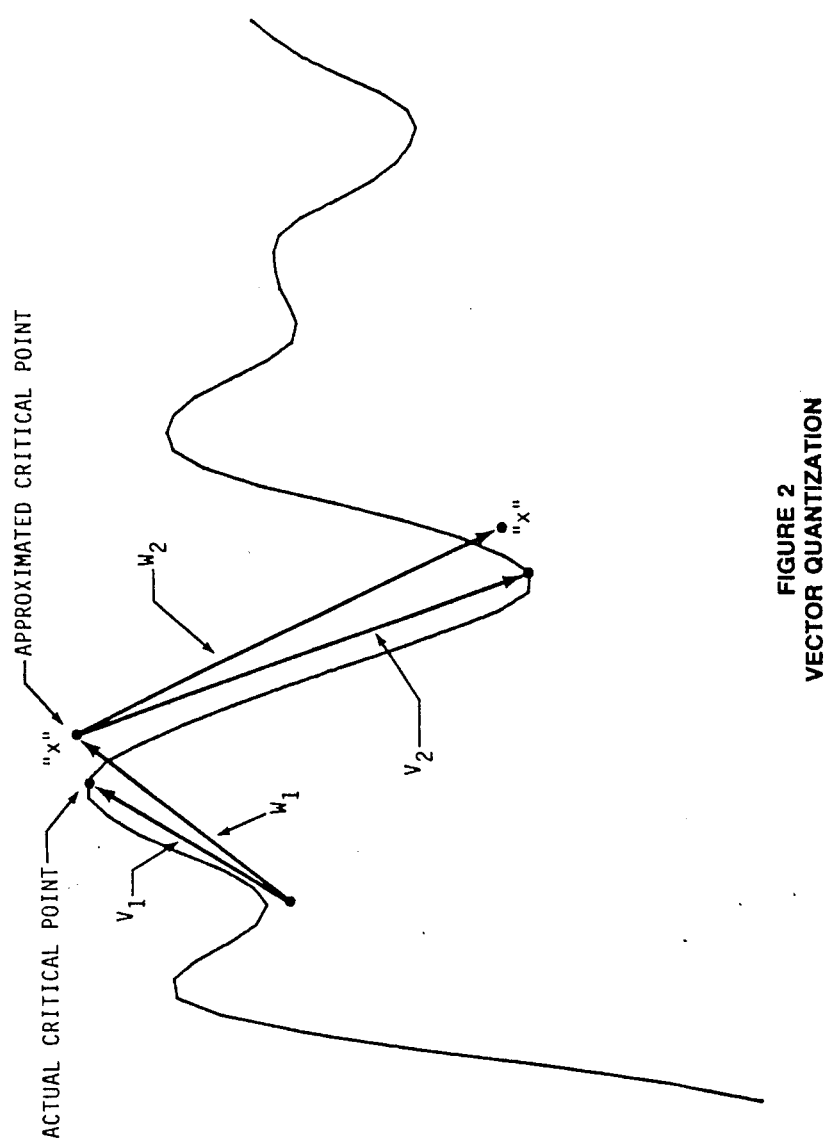
FIG. 2 is a graph of signal amplitude versus time, showing vector quantization.

A block diagram of the critical point coder (CPC) is shown in FIG. 1.

The CPC algorithm is a new approach to waveform coding by which only those samples significant for defining the overall structure of the waveform are transmitted. The missing samples are reconstructed by the receiver using an approximating interpolation function. Initial test results show that the CPC has the potential to achieve both high quality speech and low cost implementation.

2.0 Functions

The essential functions of the CPC algorithm, as shown in FIG. 1, are as follows:

a. Find those points in the speech waveform where it is changing directions most rapidly. These are the critical points.

b. Code and transmit the vectors which connect successive critical points.

c. Use these vectors in the receiver to determine (approximately) the location of the critical points.

d. Use an interpolation function to construct the speech waveform between the critical points.

3.0 CPC—The Basic Concepts

The basic idea of the Critical Point Coder can be described as follows. Consider the sampled waveform in FIG. 1A. This is a typical section of voiced speech corresponding to 16 milliseconds (msec) of time, or 256 samples. Many of the samples can be discarded so that those left give a good approximation of the waveform when the gaps are suitably interpolated. Those samples which lie on relatively straight parts of the signal are easily approximated by an interpolation process. Thus, by keeping only the circled points, the waveform shown in FIG. 1B is obtained when the gaps are approximated by cubic polynomials.

The circled points are called critical points, and the function connecting the critical points is called the interpolating function. Since the interpolating function depends only on the endpoints, the receiver can construct the waveform in FIG. 1B if it receives from the transmitter only the location of the critical points. Thus, for this example, the receiver was able to generate a good replica of the original 256-sample waveform from only the 33 transmitted critical points. While this represents a large reduction over the original 256 data points, it is important to note that the critical points are not uniformly spaced in time. Therefore, data must be transmitted concerning the horizontal as well as the vertical coordinates of the critical points. The following sections describe these ideas in more detail.

3.1 Non-Uniform Coding of Speech Waveforms

Medium-band speech coders have typically been waveform coders. This means that the coder tries to track the input signal or waveform without a priori knowledge of its structure, origin, or final destination (usually the ear). Moreover, most waveform coders generate output data at a uniform rate relative to the input. Consider, for example, a 16 kbps waveform coder which takes in data at a rate of 96 kbps, i.e., 8,000 12-bit samples each second. For each 12-bit input sample, a 2-bit output sample is produced, resulting in a uniform output data rate. Although a uniform output rate simplifies coding, it results in a scheme in which all samples are treated equally. Thus, an equal number of bits are used to code a very smooth and regular portion of a waveform as is used to code a very erratic portion of the same time duration.

The CPC concept asserts that some samples of the waveform are more important than others and, therefore, deserve more bits in the coding process. The result is a non-uniform output bit rate relative to the input bit rate. This is an advantage because the extra bits can be used to code those samples which are more important. It is a disadvantage because the bit rate fluctuates, and measures must be taken to uniformize it. This results in a somewhat more complex algorithm than the medium-band Adaptive Differential Pulse Code Modulation coders.

3.2 Definition of Critical Points

While a theory does not exist which defines unequivocally where the critical points are, it seems reasonable that they should occur where the waveform changes direction most drastically. The rate of change of direction in a curve is embodied in the concept of curvature. More precisely, curvature is defined as follows. For a plane curve C, a pair of parametric equations, $x = g(s)$ and $y = h(s)$, can be found. They give the coordinates of the points on the curve as a function of the arclength parameter s. The vector $$T(s) = \frac{dg(s)}{ds} \bar{i} + \frac{dh(s)}{ds} \bar{j}$$

always has unit length and is tangent to the curve at $(g(s), h(s))$. Since $T(s)$ always has unit length, any change in the vector is a result of a change in the direction of the underlying curve. Thus, the scalar function $$K(s) = \left| \frac{d\bar{T}(s)}{ds} \right|$$

describes changes in the direction of the curve relative to uniform motion along the curve. $K(s)$ is defined to be the curvature at $(g(s), h(s))$. For curves of the form $y = f(x)$, it is not hard to show that the curvature at $(x, y)$ is given by $$K = \frac{|f''(x)|}{(1 + f'(x)^2)^{3/2}}$$

Since curvature involves derivatives which in turn require continuous data, there still remains the questions of how to define this concept for sampled data. This is a practical question which will be addressed in Section 4.1.

3.3 Vector Quantization

Figure 3A:
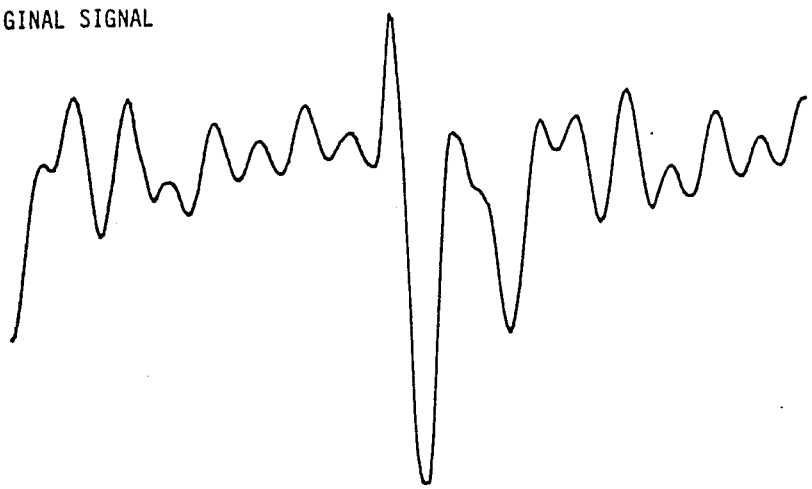
FIGS. 3A and 3B are graphs of signal amplitude versus time, showing reconstruction using quantized vectors.
Figure 3B:
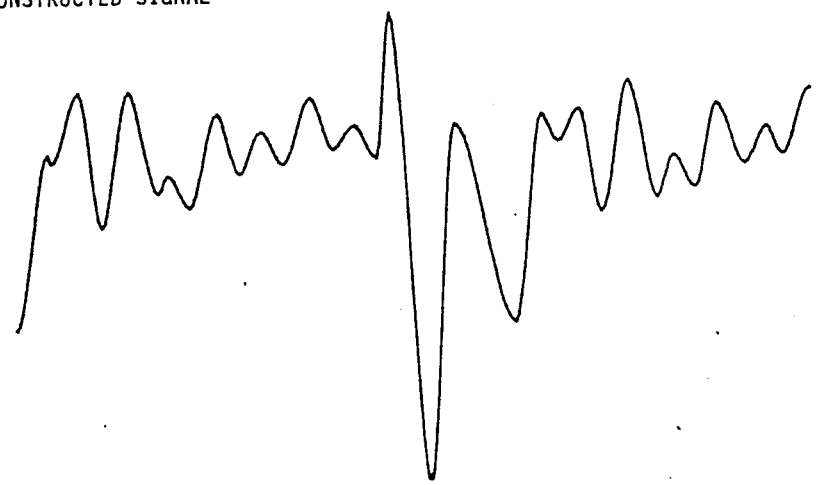

Once critical points have been chosen, it is necessary to encode and transmit their location. The most obvious technique is to simply transmit the horizontal and vertical coordinates. This leads to unacceptably high data rates due to the large possible range of these coordinates. A better approach is to encode the vectors which connect successive critical points. Since the vectors which represent differences are subject to quantization error, it is important to prevent error accumulation which may result. This can be accomplished as follows (refer to FIG. 2). Suppose there is a small finite table of vectors from which the vectors to be transmitted are chosen. Suppose further that the algorithm has been able to generate a waveform up to the first point marked "x". The transmitter knows the exact location of the next actual critical point as well as the last approximated critical point. It can, therefore, determine the vector V, which should be sent to the receiver. The transmitter selects from its small table of vectors (also known to the receiver) the best approximation to V, say W, which it transmits. The receiver then knows the locations of the approximated critical points and can construct the interpolating function between them. FIGS. 3A & 3B show a reconstruction from quantized vectors using an early prototype vector table.

3.4 Waveform Reconstruction

The problem of finding a mathematical model for the speech waveform between the critical points is a practical one and must be answered by experimentation. Nevertheless, the following two properties are desirable.

a. The interpolating function should be monotonic between critical points.
 b. For voiced speech the interpolating functions should join smoothly at critical points.

In the reconstruction of FIG. 3B, cubics were used as the interpolating function. Since the critical points occurred at peaks in the signal, the cubics had derivatives of zero at the junctions. These conditions uniquely specified the coefficients of the cubics. It may also be desirable to impose continuity of the second derivatives. When this is done for cubic interpolating functions, the values of the first derivative cannot be given but are determined by the condition of continuity. This latter method, called cubic splining, has certain advantages but requires more computation.

4.0 Practical Considerations

Figure 4:
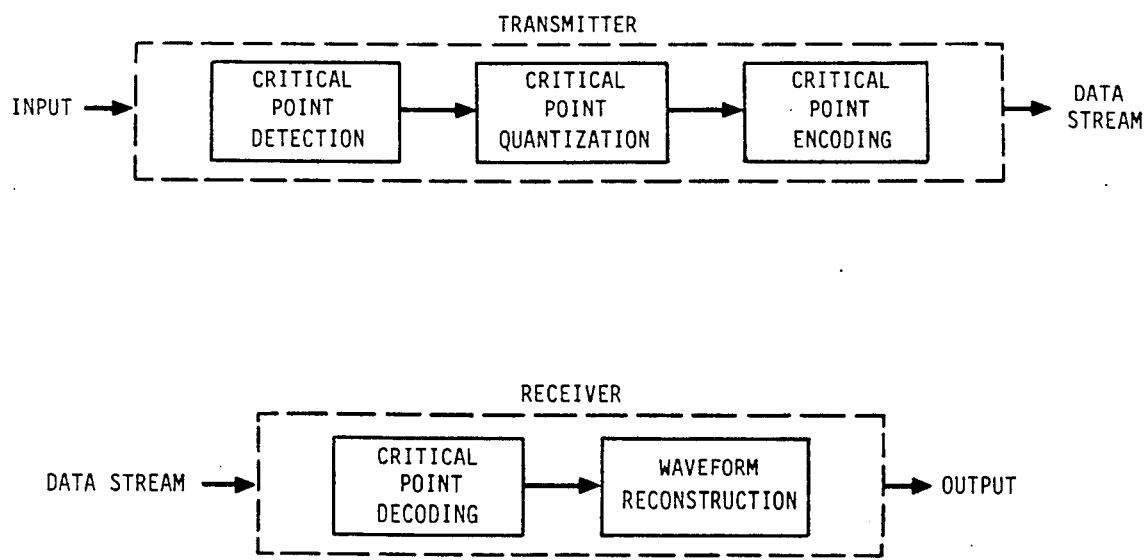
FIG. 4 is a block diagram showing functions of the critical point coder.

In this section, some of the practical problems have been addressed during implementation of the Critical Point Coder are considered. An algorithm of this type requires procedures for detecting, quantizing, and encoding/decoding the critical points, as well as reconstructing the waveform (see FIG. 4). The following discussion will suggest possible methods for each of these procedures, all of which were tried during the course of this project. However, only the details for those techniques and methods which are implemented in the current algorithm will be given.

4.1 Critical Point Detection

Critical points were defined in terms of curvature, which can be expressed as $$K(t) = \frac{|y''(t)|}{(1 + y'(t)^2)^{3/2}} \quad (1)$$

Since $y'(t)$ and $y''(t)$ are defined only when dealing with a continuous function, they must be estimated in some manner from the sampled speech data. This can be accomplished as follows. Suppose that the sampling interval is T. Then the samples $y_n = y(nT)$ for all n are available. Reasonable estimates for $y'(nT)$ are $$(y_{n+1} - y_n)/T = \Delta/T \quad (2)$$

or $$(y_n - y_{n-1})/2T = \Delta_{n-1} \quad (3)$$

or $$(y_{n+1} - y_{n-1})/2T = (\Delta_n + \Delta_{n-1})/2T \quad (4)$$

and for $y''(nT)$ $$(\Delta_n - \Delta_{n-1})/T = (y_{n+1} - 2y_n + y_{n-1})/T. \quad (5)$$

Figure 5:
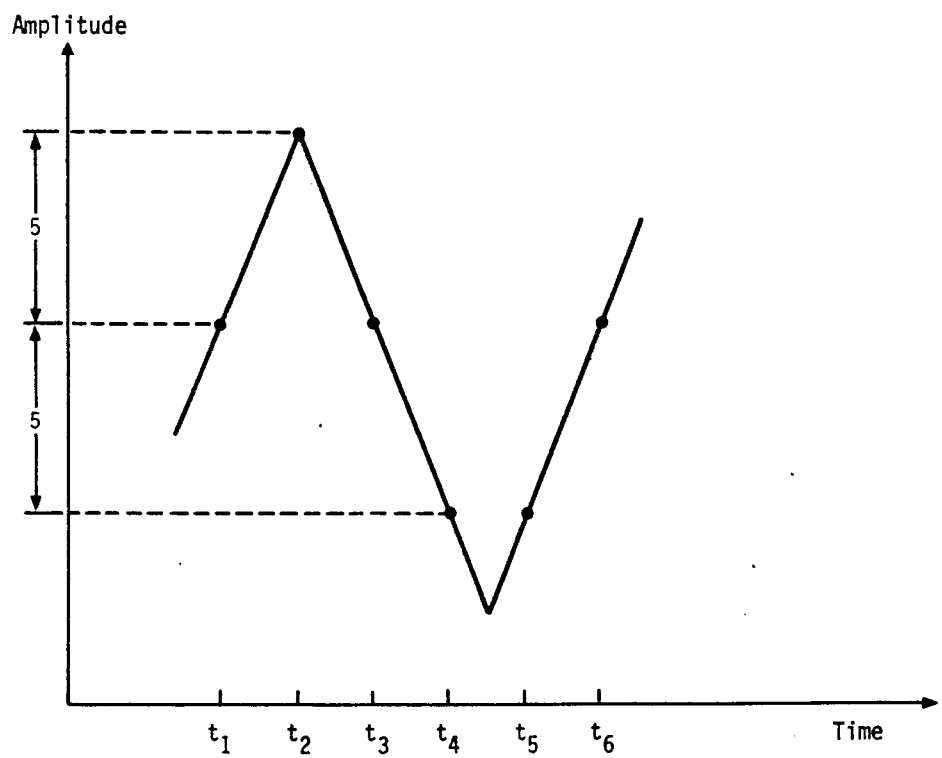
FIG. 5 is a graph showing and example of curvature calculation.

Although these estimates for the derivatives can be used to calculate curvature, unfortunately they can lead to inaccurate and inconsistent values. These difficulties stem from using an insufficiently small sample interval T, as well as from round off error. Consider, for example, the waveform shown in FIG. 5. If the curvature, as defined in Equation (1), is calculated at the samples $t_2$, $t_4$, and $t_6$, using Equation (2) for $y'(nT)$ and equation (5) for $y''(nT)$, the estimates of curvature obtained are 0.0754, 5, and 0.0377, respectively. Using Equation (3) for $y'(nT)$, the estimates of curvature at samples $t_2$, $t_4$, and $t_6$ are 0.0754, 0.0377, and 5, respectively. And finally, using Equation (4), the estimates obtained are 10, 0.2561, and 0.2561 for the samples $t_2$, $t_4$, and $t_6$, respectively. It is clear from Equation (1) that curvature along straight lines is zero and at corners it is infinity. For the curve shown in FIG. 5, this implies that the curvature at sample $t_2$ should approach infinity and at samples $t_4$ and $t_6$ it should approach zero. For the three calculations made above, only the results which used Equation (4) for $y'(nT)$ came close to how the curvature should react for this curve. Even this approximation is only marginal because the sampling interval was too large, but it is the closest because a symmetric estimator for the derivative was used. The following three sections discuss various ways in which the critical points can be detected using sampled data.

4.1.1 FIR Filters and Curvature Estimation

The estimators described previously for $y'$ and $y''$ are second order finite impulse response filters. This suggests that their performance as estimators may be improved by using higher order filters. The frequency response of a filter is determined by its action on the function $e^{iwt}$. Since the derivative of $e^{iwt}$ is $iwe^{iwt}$, differentiation is accomplished by a filter with frequency response $H_1(w) = iw$. Thus, the convolution, $h_1 * y(n)$, is an improved estimate for the first derivative $y'$. Similarly, a filter with frequency response $H_2(w) = -w^2$ can be used to estimate the second derivative. Thus, if $h_1(n)$ and $h_2(n)$ are filters with a frequency response as mentioned, using the formula given in Section 3.2, the expression $$k(n) = \frac{|h_1 * y(n)|}{(1 + (h * y(n)^2)^{3/2}}$$

is an estimator for the curvature at n in the sampled waveform y. Although the use of higher order filters provides a more accurate estimation of the derivatives, it requires considerably more computations.

4.1.2 Least-Square Polynomials and Curvature

Another approach to estimating the curvature is through the use of approximating polynomials. First, a polynomial of some predetermined order is fit by the least squares method to a segment of data in the neighborhood of the point in question. Once the coefficients of this polynomial have been determined, the curvature of this polynomial can be explicitly computed at the point. This value is then used to estimate the curvature of the original signal. More specifically, suppose $$P(x) = \sum_{j=0}^{N} a_j x^j$$

is to be fit to the data points y(n−M), ..., y(n+M), where the origin of the coordinate system for this representation of the polynomial corresponds to sample index n. The square error of approximation is given by $$E(a_0, \ldots, a_N) = \sum_{k=-M}^{M} (y(n-k) - P(k))^2.$$

The minimum square error occurs when $$\frac{\partial E}{\partial a_i} = 0 \text{ for } i = 0, \ldots, N.$$

Since, $$0 = \frac{\partial E}{\partial a_i} = \sum_{k=-M}^{M} 2(y(n-k) - P(k))k^i,$$

by expanding P, canceling the 2, and interchanging the order of summation $$0 = \sum_{k=-M}^{M} k^i y(n-k) - \sum_{j=0}^{N} a_j \sum_{k=-M}^{M} k^{j+i}.$$

This is a nonsingular system of linear equations in the unknowns $a_0, \ldots, a_n$. In order to calculate the curvature of x=0, it is necessary to know P'(0); however, P'(0)=$1_1$, and P''(0)=$2a_2$. Thus, the above system of linear equations needs to be solved for only two of the N+1 unknowns. The curvature is then given by $$K = \frac{2|a_2|}{(1 + a_1^2)^{3/2}}$$

Figure 6A:
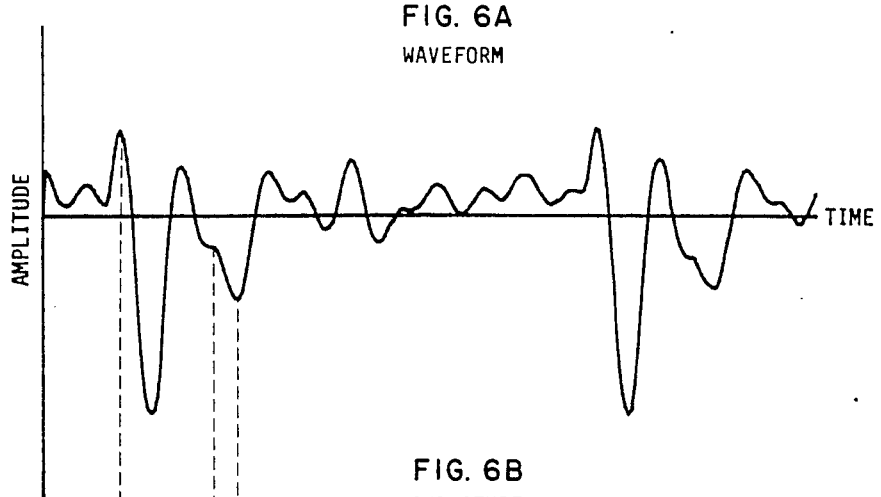
FIGS. 6A and 6B are graphs of a waveform and curvature respectively, showing a curvature calculation using least-square polynomials.
Figure 6B:
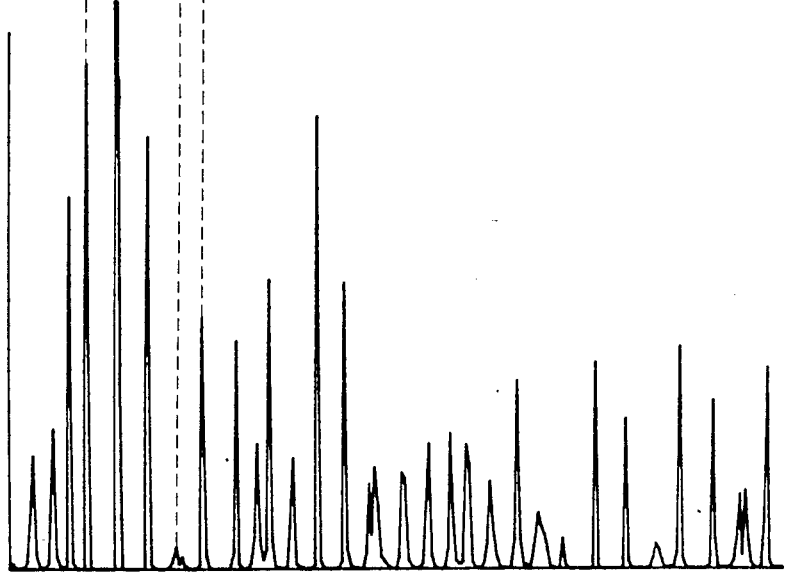

This technique was applied using a second-order (N=2) polynomial to approximate five successive samples (M=2). FIG. 6A shows a time domain waveform, and FIG. 6B shows a plot of its curvature obtained by this method. It is interesting (and important) to note that the maxima in the curvature tend to correspond to the peaks and valleys of the speech signal.

4.1.3 Critical Points and Local Extrema

There is a strong correlation between critical points defined as local maxima in the curvature and those defined as peaks and valleys of the time domain waveform. Detection of peaks and valleys in a waveform is much less complicated than detecting the local maxima in the waveform's curvature. This suggests the use of the more easily detected peaks and valleys as indicators of critical points. If critical points were to be restricted only to such points, certain kinds of coding errors would result. FIG. 7A shows a waveform in which critical points would be assigned to samples A, B, C, and D, using the curvature data shown in FIG. 7B. However, when the critical points are defined simply as local extrema of the signal, only samples A and D would be identified as critical points. By using a cubic polynomial to reconstruct the signal between points A and D, the error which is shown in FIG. 7C is produced. Whether the errors made by ignoring critical points such as B and C are significant is a practical question. The relevant considerations include the relative number of occurrences of the situation shown in FIGS. 7A–7C, the perceptual effect of this kind of error, the complexity of the algorithm, and the bit rate of the coder.

4.2 Vector Quantization and Bit Rate Considerations

The viability of the CPC technique depends on the ability to code the critical points, or vectors, with a sufficiently small number of bits to maintain the desired data rate. This depends on the number of vectors, as well as the variety of vectors which occur. Empirical studies show that an average of about two vectors per millisecond can be expected for voiced speech. This is consistent with the fact that voiced speech generally has most of its energy below 1 kHz. On the other hand, vectors during unvoiced speech occur at about the rate of 6 per millisecond. This corresponds to a sine wave of frequency 3 kHz. The bit rate of the coder is then calculated by $$\frac{\text{bits}}{\text{sec}} = \frac{\text{vectors}}{\text{sec}} \times \frac{\text{bits}}{\text{vector}}.$$

Thus, in order to achieve 16 kbps coding using the average values just mentioned, the number of bits per vector is given by $$\frac{16 \text{ kilobits}}{\text{sec}} \div \frac{2 \text{ vectors}}{\text{msec}} = \frac{8 \text{ bits}}{\text{vector}}$$

for voiced speech and $$\frac{16 \text{ kilobits}}{\text{sec}} \div \frac{2 \text{ vectors}}{\text{msec}} = \frac{2.67 \text{ bits}}{\text{vector}}$$

for unvoiced speech. Hence, the size of the table of vectors from which vectors can be chosen to represent voiced speech is $2^8 = 256$ and for unvoiced speech is $2^{2.67} = 6$.

During the early stages of development, the use of two vector tables, with characteristics described above, was thought to be sufficient. This is not the case for several reasons. First, the variability of vectors during voiced speech cannot be accurately represented by only 256 vectors, nor can unvoiced speech be accurately represented by only 6 vectors. Second, transition regions from voiced to unvoiced or vice versa would have to be specially handled. And third, the choice of which table to use requires a voicing decision, resulting in extra complexity. For these reasons and more, schemes were developed in which quantization of the vectors was made with less error. This was achieved by (1) reducing the number of critical points, thus, increasing the number of bits per vector, (2) reducing the range of the signal, thus, reducing the variability of the vectors, and (3) adaptively allocating bits among short intervals of the signal. These schemes are described in the following sections.

4.2.1 Reducing the Number of Critical Points

Figure 8:
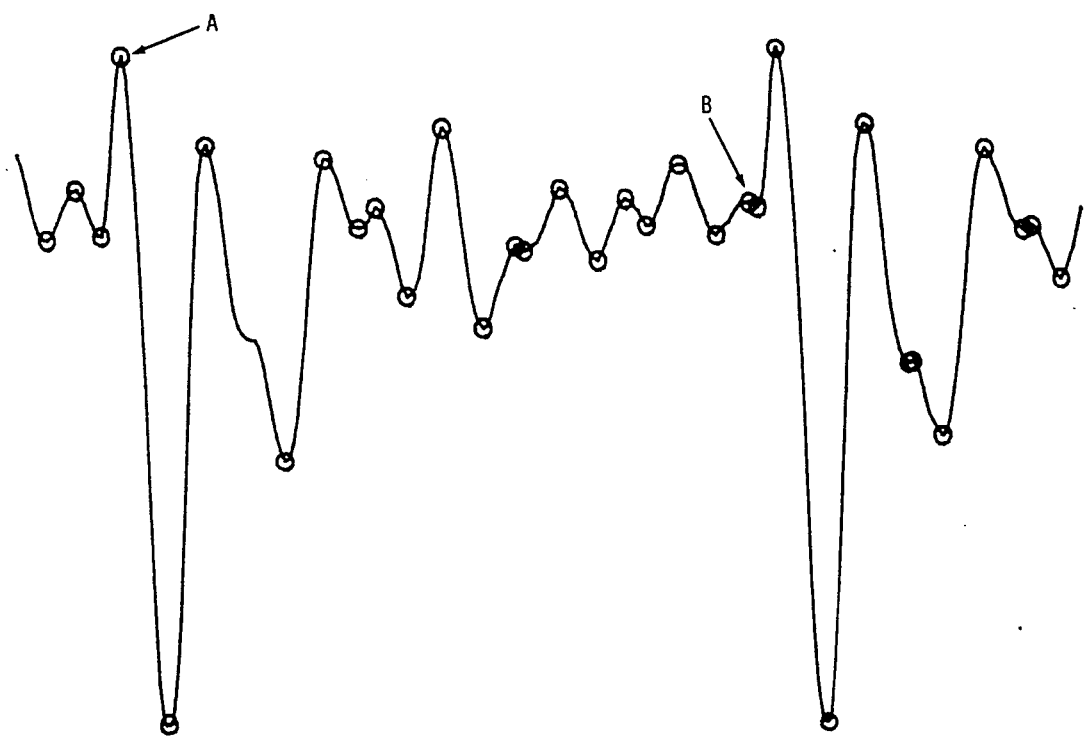
FIG. 8 is a graph showing the relative importance of critical points.

Since the data rate at which this algorithm operates is heavily dependent on the number of critical points which occur, it is also essential to have a mechanism for removing less important critical points. This is illustrated in FIG. 8 which shows a section of voiced speech where the critical points have been circled. It is evident from the figure that the loss of critical point A would result in a far greater error in the reconstructed signal than the loss of critical point B. Two approaches for eliminating less significant critical points such as B were developed and are described below.

The first approach uses vector length as the criterion for the relative importance of critical points. Note that in FIG. 8 the vectors which connect A to its neighbors are much longer than the vectors which connect B to its neighbors. A "weeding out" procedure based on this criterion involves computation of vector lengths, sorting the vectors by length, and some further decision-making. This procedure tends to be rather complex because of the sorting and decision-making processes. The complexity of the decision process arises from the fact that the rejection length is a function of the local signal structure.

The second approach consists of low-pass filtering the signal. Here, also, the local signal structure plays a role. Because of the vast difference in structure and frequency content between voiced and unvoiced speech, fixed filters do not work. The practical problem then is to design an adaptive filter which responds appropriately to the structure of the speech waveform. Such an adaptive filter is described in the following discussion.

Voiced speech has associated with it a high energy content and a relatively low frequency content. Even when formants exist in the higher frequencies, they are usually of much lower energy than the first formant which generally occurs below 1 kHz. Thus, significantly more filtering can occur in voiced speech than in unvoiced. This is useful since in voiced speech insignificant critical points arise from factors which affect the high frequency end of the spectrum.

For unvoiced speech it is desirable to keep as much high frequency information as possible while still reducing the number of critical points. While these seem to be conflicting goals, it is possible to reach this objective at least in a limited sense.

The following scheme has been successful in meeting the objectives for both voiced and unvoiced speech. The scheme is as follows. Let x(n) be a sequence of sample values of the speech signal and define the new output as $$y(n) = \frac{1}{2N(n)} \sum_{k=-N(n)+1}^{N(n)-1} \left(1 + \cos\frac{\pi k}{N(n)}\right) x(k).$$

N(n) is the number of filter taps and can be determined as follows. Assume y(n−1), y(n−2), ... are known, the compute z(n), e(n), and ρ(n) from $$z(n) = az(n-1) + x^2(n-1)$$

$$e(n) = ae(n-1) + (x(n-1) - y(n-1))^2$$

$$\rho(n) = \frac{z(n)}{e(n)}$$

where ρ is a parameter. N is defined to be a monotonically increasing function dependent on ρ. The exact functional dependence of N on ρ was resolved by experimentation. The relation shown in FIG. 9 works well for speech sampled at 16 kilosamples per second. The samples y(n) which are the output of this adaptive filter are then analyzed for the occurrence of critical points which will be temporarily called pseudocritical points. The real critical points are then defined by letting (1) their time coordinate be given by those of the pseudocritical points and (2) their amplitude coordinates be given by the amplitudes of the original signal at these times.

Figure 10A:
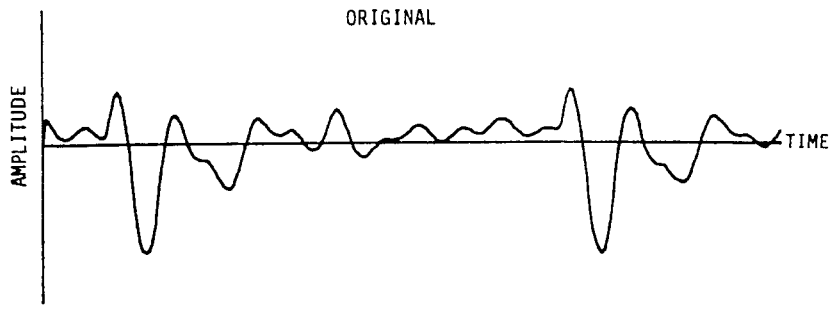
FIGS. 10A, 10B and 10C are graphs showing the effect of adaptive filtering on voiced speech.
Figure 10B:
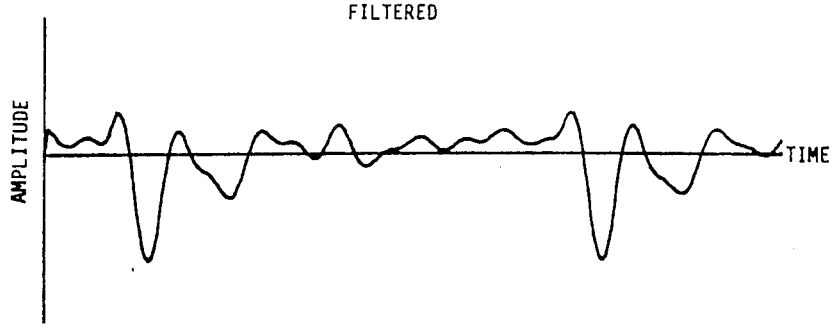
Figure 10C:
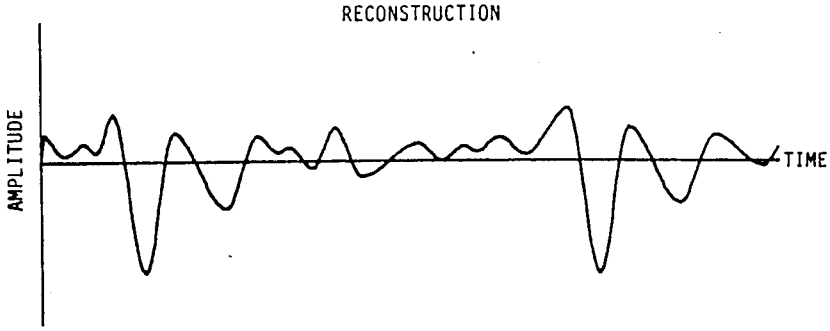
Figure 11A:
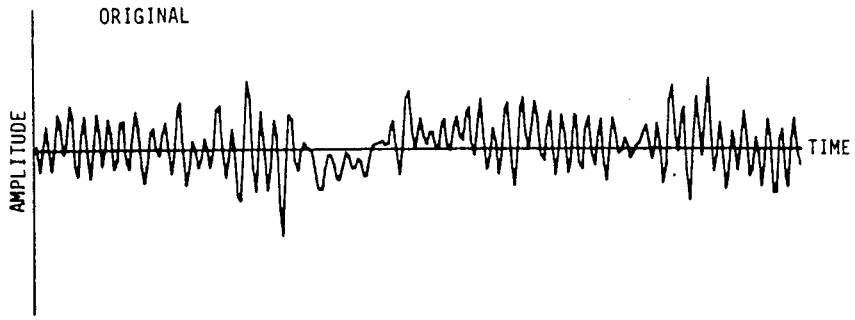
FIGS. 11A, 11B and 11C are graphs showing the effect of adaptive filtering on unvoiced speech.
Figure 11B:
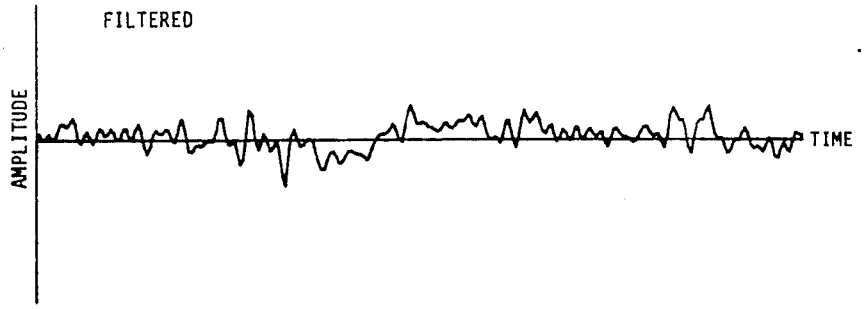
Figure 11C:
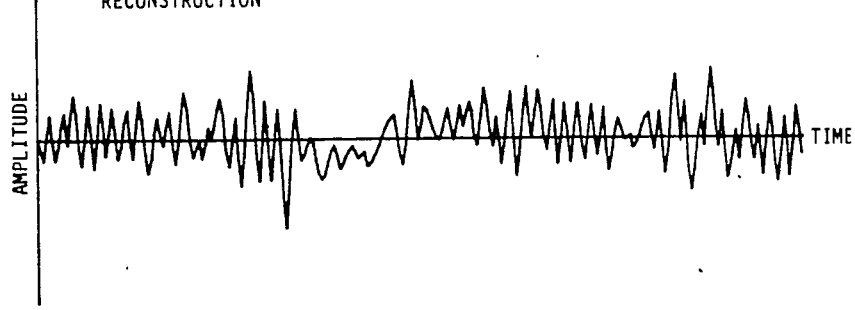

The effectiveness of this method is demonstrated in FIGS. 10A-10C and 11A-11C. FIG. 10A shows a section of voiced speech, FIG. 10B the output from the adaptive filter, FIG. 10C and the resulting reconstructed waveform. As seen, there are more critical points present in the original speech than after filtering. However, the remaining critical points are crucial in retaining the overall structure of the signal. FIGS. 11A-11C illustrates the situation for unvoiced speech. Note that there has been a reduction in energy in the filtered signal. However, the relatively large peaks in the original signal still show up in reduced form in the filtered signal. Therefore, critical points are still generated approximately in the same locations of the original waveform.

In summary, the details of this "weeding out" method can be described as follows: The filter used is a raised cosine window of varying width. Since it is important to leave the temporal location of peaks in the waveform undisturbed, the filter uses a symmetric window. The special characteristics of the filter change with N so that high frequencies are reduced as N increases. The value N=1 corresponds to no filtering at all. The terms z(n) and e(n) correspond respectively to the input signal energy and to the energy removed by the filter up to that time. The ratio ρ(n), therefore, gives a measure of the energy removed by the filter relative to the energy present. Since N(n) increases with ρ(n) and increasing N(n) means more energy removal at high frequencies, the filter bandwidth will tend to track the signal bandwidth. This is precisely the action needed to handle the diverse signal structures encountered in speech.

4.2.2 Reducing the Variability of the Vectors

The ability of the quantizer to approximate the original vectors is related to their variability. If the distribution of vectors were precisely known, the vectors could be quantized with little error. Since this distribution is not known, certain constraints can be placed on the vectors so that the distribution becomes limited in a known way. Two methods for doing this are described in the following sections.

4.2.2.1 Limiting the Set of Admissible Vectors

Without constraints, the set of vectors which can occur in voiced speech is large. Assuming a 12-bit Analog-to-Digital (A/D) converter results in $2^{12}$ possible values for the vector amplitude components. Experiments have shown that the time components tend to range from 1 to 16 (assuming an 8 kHz sample rate), or $2^4$ possible values. Thus, the unquantized vector table has $2^{16}$ entries. As mentioned in the last section, an average of only $2^8$ table entries is possible if the 16 kbps data rate is to be achieved. To represent a possible $2^{16}$ vectors by only $2^8$ vectors would result in a rather coarse quantization.

Figure 12A:
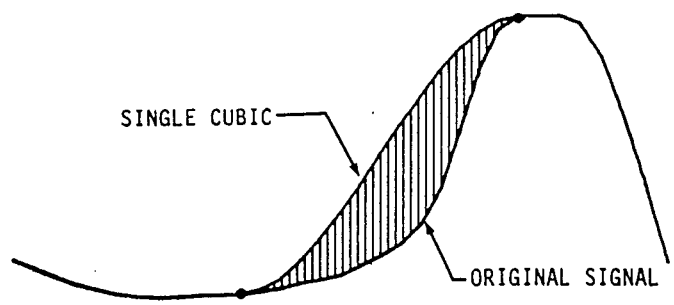
FIGS. 12A and 12B are graphs showing the effect of replacing one long vector by two short vectors.
Figure 12B:
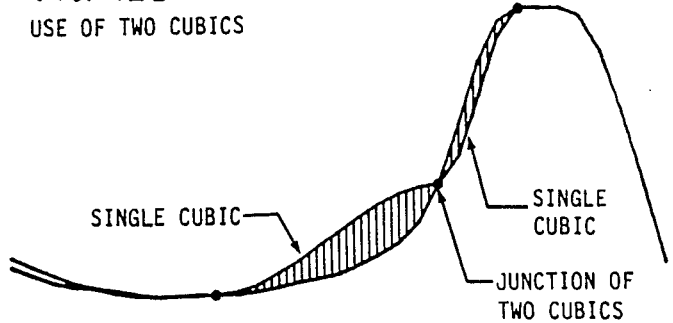

This problem can be overcome by exploiting the fact that extreme vectors (ones with large components) occur infrequently. It is, therefore, advantageous to replace large vectors by a sum of two (or more) smaller vectors. These smaller vectors are taken from a reduced table which can be more finely quantized. While this results in coding more vectors, the reduction in table size keeps the data rate the same. The effect of replacing one vector by two is shown in FIGS. 12A & 12B. FIG. 12A illustrates one cubic being used to join the two critical points. This corresponds to a single long vector. FIG. 12B shows the single long vector that has been replaced by short vectors. For this specific shape of the original signal, there has been a reduction in the error of approximation. This error reduction usually occurs when replacing one long vector by two or more smaller vectors. The error can generally be made even smaller if cubic splining is used at the junction point.

Experiments show that restricting the time coordinates of vectors to a maximum of 2 msec and the amplitude to one-half of the total dynamic range has been most effective in limiting the set of admissible vectors without producing noticeable error.

4.2.2.2 Companding

Another method for reducing the set of admissible vectors is companding. Although this does not restrict the time components of the vectors, it does reduce the amplitude component. Companding consists of compressing the input vector to the transmitter and then expanding it in the receiver by the inverse of the compression function. While this clearly reduces the dynamic range of the vectors to be processed, the effects of quantization errors are magnified at the receiver during the expansion process.

Compression functions are generally nonlinear because it is desirable to compress the higher amplitudes while slightly expanding the lower amplitudes. The advantage of this is that, when the compressed coded vectors are expanded in the receiver, a larger quantization error results for the high amplitude vectors than for the low amplitude vectors. In effect, companding makes linear quantizers behave nonlinearly. While it is undesirable to increase quantization errors, they can be more tolerated at high amplitudes. This effect must be balanced against the advantage gained by a smaller dynamic range.

The compression function adopted for use in the CPC uses a square root function. Three parameters specify the function. Two of the parameters define the maximum input and output values. The third specifies the derivative of the compression function at an input of zero. This parameter must exceed 1 and in effect controls the amount by which low level inputs are amplified. The precise form of the compression function is $$f(x) = \frac{-m + \sqrt{m^2 + 4ax}}{2a}$$

where
 $1/m$ = the derivative of f at 0,
 b = maximum input value,
 a = maximum output value.
The expansion function is then given by $$f^{-1}(x) = ax^2 + mx$$

Figure 13:
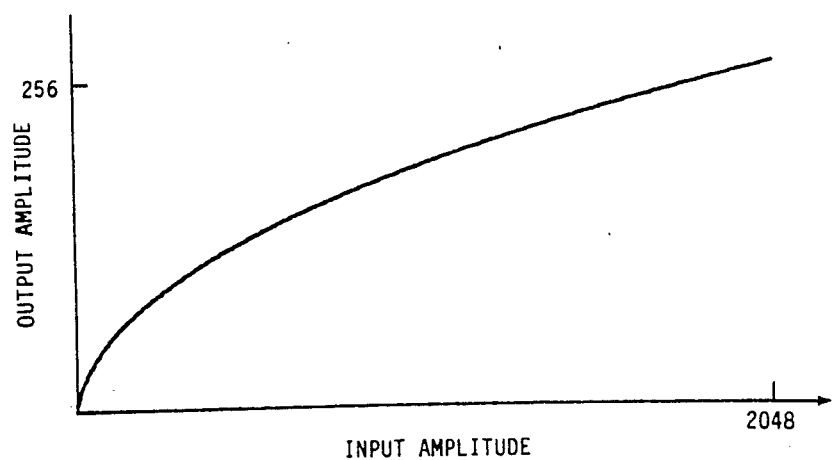
FIG. 13 is a graph showing a compression function for reducing variability of vectors.

A graph of $f(x)$ for $m=\frac{1}{2}$, $a=256$, and $b=2048$ is shown in FIG. 13.

The effect of using companding with these parameter values in the CPC is shown in FIGS. 14A, 14B, 15A, and 15B. FIG. 14A shows the original waveform and the reconstruction using cubics. FIG. 14B shows the distribution of the vectors. In FIGS. 15A & 15B, the reconstructed signal was formed by first compressing the input, locating critical points of the compressed signal, quantizing the resulting vectors, and expanding the output. Note that the companding process has introduced some additional error. However, this error is offset by the finer quantization of the vectors which results from the reduced dynamic range.

4.3 Adaptive Quantization

During the development of the CPC, it has become apparent that the use of a small number of fixed tables will not be sufficient for quantizing the wide variety of vectors present in speech. It is necessary to somehow choose a quantization scheme which is continuously adapting to the changing distribution of vectors. The changes in the distribution can be caused by changing frequencies, changing levels, or transitions from voiced to unvoiced and vice versa. The following two sections describe two methods for adaptively choosing a vector table based on characteristics of the speech signal.

4.3.1 Adaptation Based on Energy Content

Figure 16:
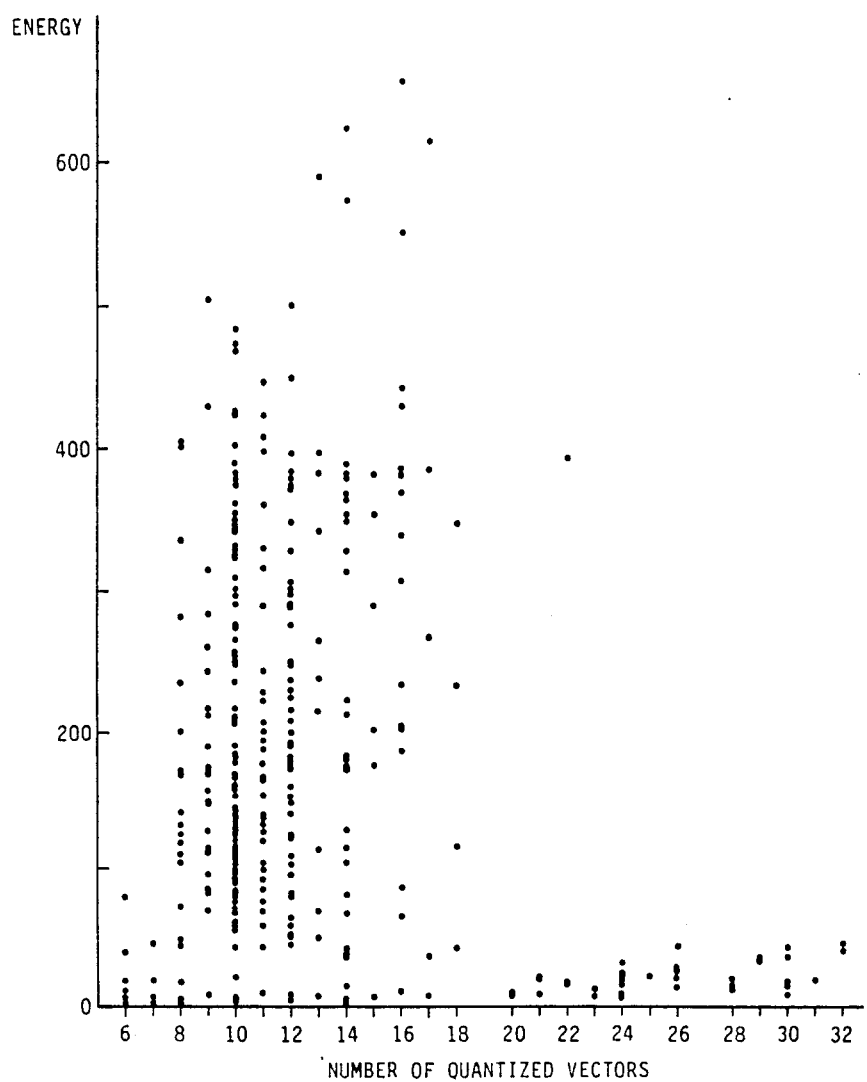
FIG. 16 is a graph showing distribution of vectors as a function of number of vectors versus energy content.

Casual inspection of speech waveforms shows a correlation between energy and the average magnitude of the vectors. It was thought that this fact might be exploited in a general table adaptation scheme whereby the energy content is used to choose a particular quantization table. Experiments were run to test the viability of this idea. A speech signal was divided into contiguous 4-msec intervals. For each of these intervals, the energy was computed and the number of critical points was counted. The results are shown in FIG. 16. There is a relatively clear deliniation between voiced and unvoiced speech. This occurs at about 18 critical points per 4-msec interval. Voiced speech corresponds to the high energy areas and unvoiced to the low. However, during voiced speech the energy content takes on a large range. This implies that, although voiced speech has approximately 6 to 18 critical points, the energy content of the signal and, hence, critical point variability is high. Since the choice of an efficient vector table depends not only on the number of critical points but also on the distribution of the vectors, it appears that energy alone is not sufficient for determining vector tables.

Figure 17:
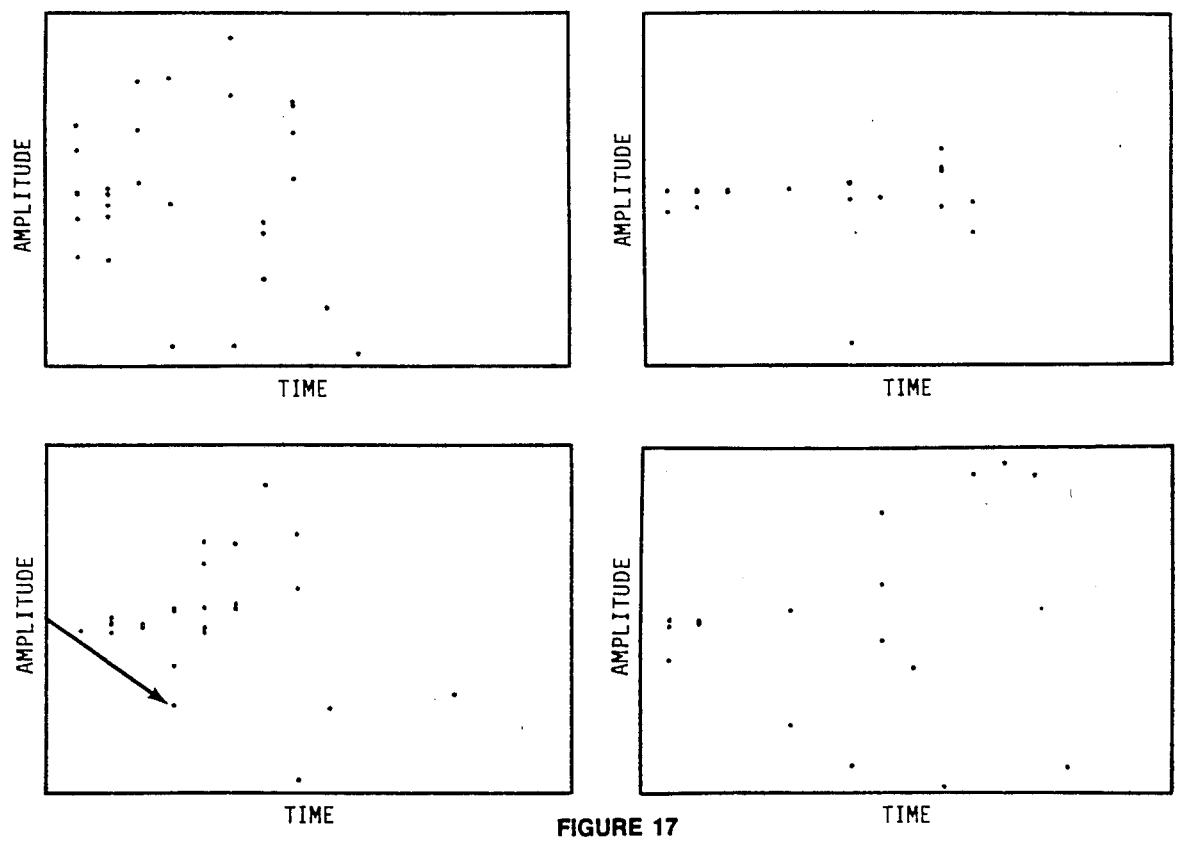
FIG. 17 is a set of graphs showing variability in the distribution of vectors during voiced speech.

To further illustrate the variability in the sets of vectors which can occur, consider FIG. 17. The plots show the vectors which occur in four 8-msec intervals of voiced speech. A single vector table which is quantized finely enough to give good approximations to each of these sets of vectors would necessarily be large.

4.3.2 Adaptation Based on Waveform Structure

A technique for defining quantization tables according to the structure of the waveform during a short interval of time has been developed. This technique is based on the assumption that the distribution of vectors which occurs during a short time period of time is not too varied. The period of time which has been used during this development is 8 msec. The general idea of this technique is to spend a considerable number of bits during the encoding process to specify the distribution of vectors for each 8 msec. The result is that, although the number of bits remaining to code the vectors is less, the size of the table has been reduced. Therefore, fewer bits are required to code each vector and also quantization can be done with less error. This technique is described in more detail in the remainder of this section.

Figure 18:
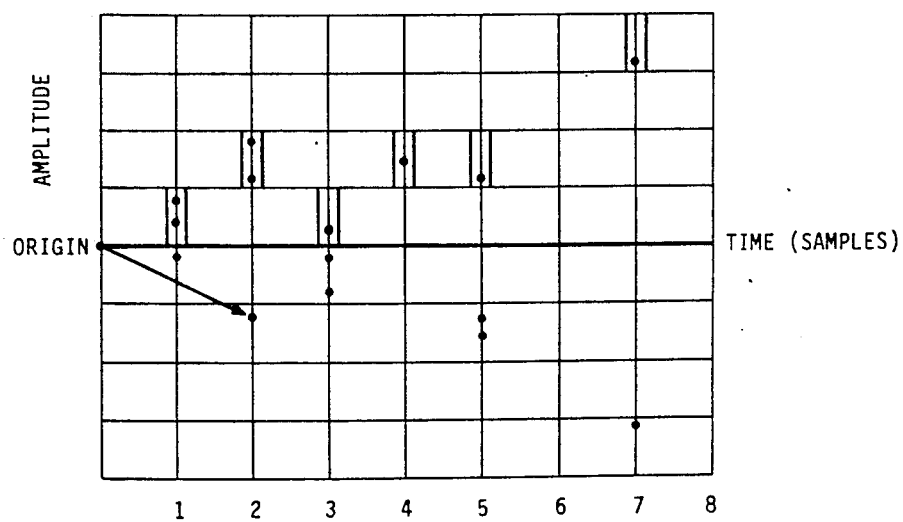
FIG. 18 is a graph of quantized table adaptation.

The number of critical points which occur in a short segment of speech (say 8 msec) is generally small. Also, successive vectors usually have alternating slopes. Assume that the time coordinates of the vectors have been limited to a maximum of 1 msec. This means that for an 8 kHz sample rate there are only eight possible values for the horizontal component of the vector. FIG. 18 shows an example of a set of 15 vectors which occurred in 18 msec of voiced speech. All vectors run from the origin to the points indicated. If vectors with negative vertical components are flipped up and the vertical dynamic range is quantized into four subsets, all vectors lie in the six darkened bands. A vector table can now be specified by the location of the bands and a quantization stepsize.

In order to calculate the stepsize, the following definitions are made:

d = time duration of the speech segment
r = the bit rate of the coder
n = the number of vectors which occur in the speech segment of duration d
v = number of coarse cells into which the vertical components of the vectors are quantized
h = number of horizontal quantization steps
l = total number of coarse vertical cells
C = size of fine quantization step for the vertical components
b = number of bits used to specify C
m = maximum absolute value of vector vertical components Then the following relationships are made:

rd = total number of bits available for the time segment of duration d
vh = the number of bits needed to specify a cell configuration
(rd-vh-b/n) = number of bits available to code each vector
(ml/v) = the combined length of all cells And thus, the stepsize C is calculated to be $$C = \frac{m}{v} 2^X \text{ where } X = -\left(\frac{rd - vh - b}{n}\right)$$

Therefore, the stepsize C is essentially a function of the distribution of vectors and the number of vectors for an 8-msec section of speech.

4.4 Bit Rate Stabilization

Since critical point coding generates data at a non-uniform rate, some mechanism must be provided for smoothing these fluctuations. The discussion in Section 4.2 indicated that the average number of critical points per unit time was compatible with a data rate of 16 kbps. Averaging over time will therefore be the main ingredient for achieving a stable transmission data rate. Averaging, however, involves buffering data, which requires extra memory and somewhat longer computations, and introduces a delay. These negative factors must be balanced against the advantages of long-time averaging.

The discussion below describes a scheme developed for the prototype CPC which stabilizes the bit rate. In the transmitter, a relatively long section of the speech signal, called the stabilization interval, is buffered. The stabilization interval is subdivided into relatively short intervals called analysis intervals. For each analysis interval, critical points are found, and the distribution of the resulting vectors is characterized in terms of a coarsely quantized vector table as discussed in 4.3.2. FIG. 18 depicted such a coarsely quantized table. The dispersion in the set of vectors is measured by the number of different coarse vertical cells which make up the table. In the example of FIG. 18, the coarse length is 6. The number of bits available for coding the data corresponding to a particular analysis interval will then depend on the number of vectors as well as the coarse length of the table.

Using the nomenclature in Section 4.3.2, the following definitions are made.

N = the number of analysis intervals per stabilization interval
$l_i$ = the coarse length of the ith analysis interval
$n_i$ = the number of vectors in the ith analysis interval and the number of times that the slope of the vectors does not change sign The stepsize C is calculated so that the total bit rate for the stabilization interval comes out to be r. For each stabilization interval, the following information must always be transmitted:

a. Nvh bits to specify the N coarse quantization tables
b. γ bits to specify the value of C Thus, r-Nvh-γ bits are left to code the vectors. For each analysis interval, $n_i+1$ table entries must be transmitted.

Table entries correspond to vectors as well as certain function switches for the receiver. The signal to override the default slope alternation among successive vectors is treated as a special entry in the vector table, as well as the entry which signals the end of data for a particular analysis interval. This allows the receiver to switch to the appropriate quantization table for the next section of data.

The total number of finely quantized steps in the table for the ith analysis interval is $ml_i/Cv$, and, therefore, $(n_i+1) \log_2(ml_i/Cv)$ is the number of bits which must be transmitted for the ith analysis interval. It follows that for the entire stabilization interval the relation $$\sum_{i=1}^{N} (n_i + 1) \log_2 (ml_i/Cv) = r\text{-}Nvh\text{-}\gamma$$

holds.

This equation can be solved for C and gives $$C = \frac{v}{m^2}(r - Nvh - \gamma - \Sigma(n_i + 1)\log_2 l_i)/M$$

The stabilization technique discussed above works well for voiced speech and for low amplitude unvoiced speech. When high amplitude unvoiced speech occurs for the entire stabilization interval, high values of C result, which lead to "crackling" speech output at the receiver. This problem is alleviated using the following technique.

The stepsize C is calculated for the stabilization interval. If it exceeds some maximum (say 0.5 percent of the total dynamic range), a separate stepsize is calculated for each analysis interval. Each analysis interval is then treated as a separate stabilization interval. For those analysis/stabilization intervals which have high stepsize values, only a fraction of the speech is coded; the rest is interpolated as follows.

The analysis interval is subdivided into an even number of short (1 to 2 msec) subintervals. Only every other subinterval is coded. Thus, the receiver first reconstructs a signal as shown in FIG. 19A. Using the window shown in FIG. 19B, it then interpolates the missing data according to the formula $$y(n+j) = h(j)y(j) + h(2n+j)y(2n+j)$$

for $j = 1, \ldots, n$, where $$h(k) = \frac{|2k - 3n - 1| - n - 1}{2n - 2}.$$

The final reconstruction is shown in FIG. 19C.

4.5 Signal Reconstruction

Figure 20A:
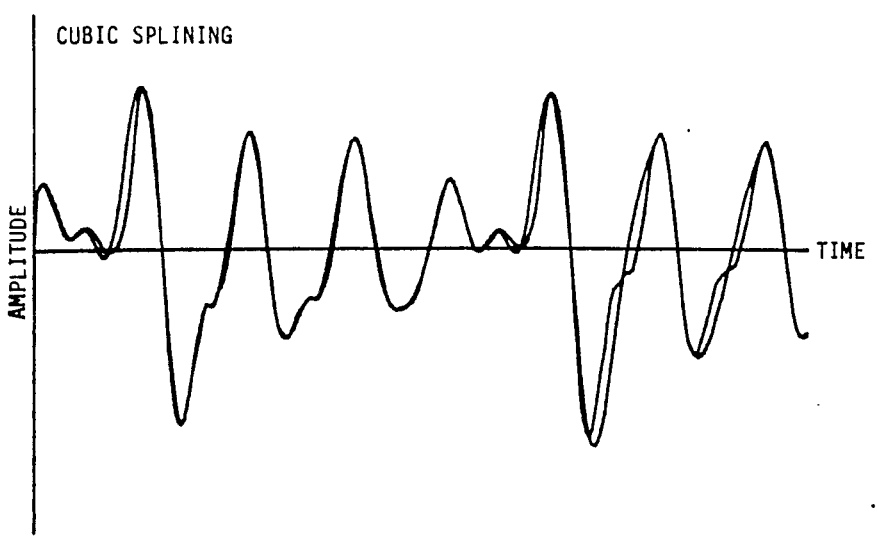
FIGS. 20A and 20B are graphs showing comparison of reconstruction using cubic splining and independent third order polynomials.
Figure 20B:
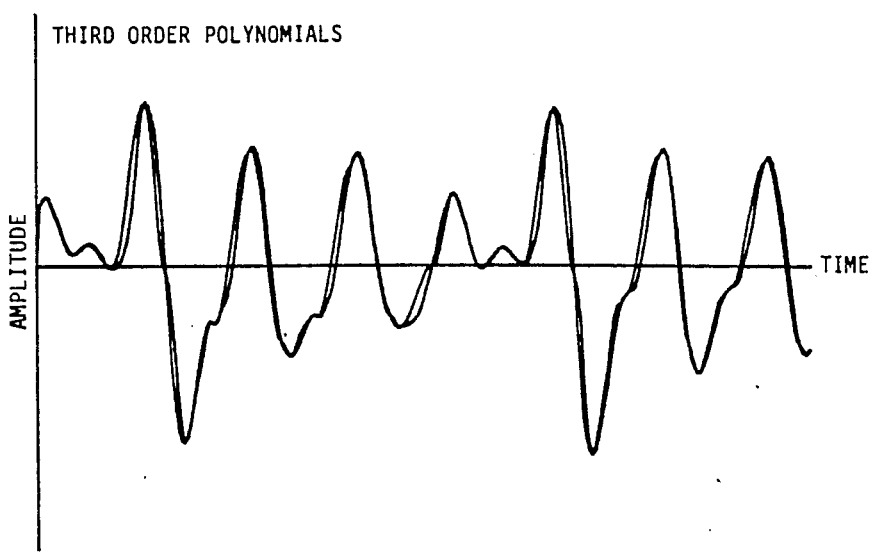

Once the receiver has obtained the location of critical points, it must interpolate the signal between the critical points. Two methods were tried. The first joins successive critical points by third order polynomials so that the derivatives are zero at the critical points. The second method uses cubic splining of critical points. In cubic splining, cubics are fit between successive data points in such a way that, at data points, they agree with the given data and have continuous first and second derivatives at the junctions. An example of the results of the two methods on a typical section of voiced speech is shown in FIGS. 20A & 20B. Cubic splining leads to smoother reconstructions and a somewhat smoother sound, especially when the speech spectrum is mostly below 1 kHz.

5.0 THE PROTOTYPE CRITICAL POINT CODER

Several methods for approaching the main functions of the CPC were given in Section 4.0. This section discusses the approaches being used in the current implementation, why they were chosen, how each of these functions are interconnected, and the ##mat of the digital bit stream to be transmitted.

5.1 Methods Chosen to Perform the Functions of the CPC

5.1.1 Critical Point Detection

Three methods were described in Section 4.1 for locating critical points. These include locating points where the curvature is locally maximum by using a Finite Impulse Response filter and an approximating polynomial and detecting the peaks and valleys in the time domain waveform. The last of these methods was chosen for several reasons. First, location of peaks and valleys can be done by merely comparing the slope of the line segment connecting the new sample and previous sample with the slope of the line segment that was formed previously. This results in a very simple computation, when compared to the other two methods. Second, peaks and valleys represent the majority of critical points which are detected using maximum curvature. Although some of the regions with high curvature are not assigned critical points, the error which resulted has not been seriously degrading to the quality of the output. In fact, by placing a constraint on the amplitude and time components of the vectors, sometimes an inflection point is inserted between the critical points by replacing one long vector by two shorter ones. This reduces the error. Third, the reduction in the number of critical points by using this method helps during the quantization process.

5.1.2 Vector Quantization

The purpose of quantizing the vectors which connect successive critical points is to achieve the desired bit rate. It is obvious that as the bit rate is increased the quantization of vectors can be made with less error and vice versa. It is desirable that the CPC be optimized for operatin at 16 kbps, although it has been implemented in such a way that the bit rate is an input parameter. Two processes have been required for achieving the 16 kbps rate. These are reduction in the number of critical points and reduction in the variability of the vectors. Although these have resulted in a trade-off between bit rate and quality, the degradation in listening quality has not been severe for 16 kbps coding.

Figure 9:
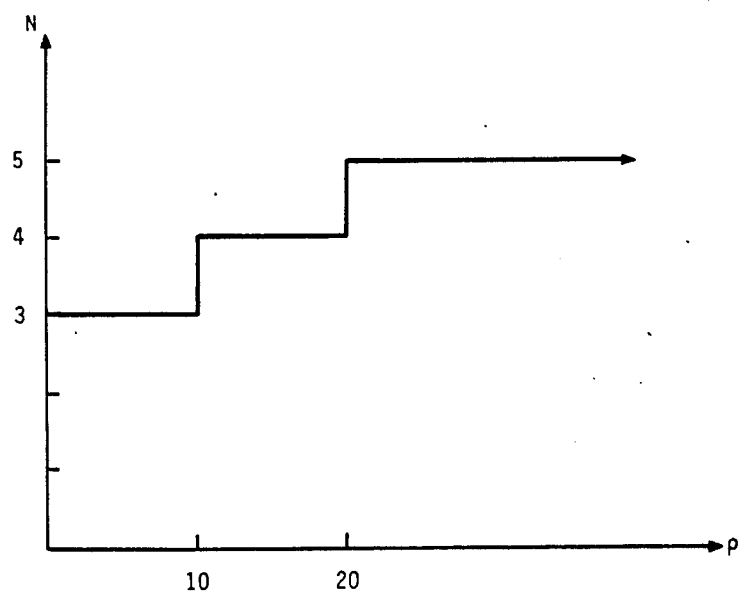
FIG. 9 is a graph showing the relationship for an adaptive filtering scheme.

Two methods for reducing the number of critical points were presented in Section 4.2.1: (1) rejection of critical points whose vector formed with the previous critical point did not exceed a minimum threshold vector length and (2) use of an adaptive low-pass filtering process. The second of these two methods has been implemented in the prototype CPC. The first method would require a somewhat complex sorting and decision-making process. It would also introduce long delays since sections of speech would have to be analyzed to determine the minimum threshold vector length. On the other hand, the adaptive filtering process introduces a very short delay depending on the number of taps of the filter. For speech input at a rate of 16 kpbs, the maximum delay is five samples as shown in FIG. 9.

Both of the two methods for reducing variability of the distribution of vectors described in Section 4.2.2 are used in the prototype CPC. The first method places a constraint on the maximum time and amplitude components of the vectors. These values are input as parameters to the CPC. Through experimentation with various values, a maximum time duration of 1 msec and maximum amplitude of one-half the total dynamic range have been optional in terms of reducing variability without greatly increasing the number of vectors. Also mentioned was that successive vectors usually have alternating slope sign. If the above constraints are made too small, this alternation will occur less frequently.

The second method used to reduce the variability of vectors is companding. This is a process whereby the signal amplitude is compressed by a nonlinear function prior to critical point detection and then expanded by the inverse function prior to the interpolation process. The precise definition of this nonlinear function was given in Section 4.2.2.2. The compression ratio of 8 to 1 has been found to be most beneficial in reducing variability without seriously degrading quality.

Both processes of reducing the number of critical points and the variability of the vectors have been instrumental in reducing quantization error. This is because less information has had to be transmitted; thus, more bits could be spent on the quantization process.

5.1.3 Vector Table Adaptation

During the development of CPC it has become obvious that a scheme for quantizing vectors must be adaptive to the behavior of the speech signal. Originally, it was thought that two quantized vector tables, one for voiced speech and one for unvoiced speech, would suffice. This has proved not to be the case, mainly due to the highly variable amplitude components of the vectors, particularly in voiced speech. Therefore, it has been necessary to develop a scheme in which a vector table can be defined for a short interval of speech. Also, the definition of this table has to be based on some criterion which describes how the signal is behaving during this time interval.

Two methods for achieving the above were described in section 4.3. The first method attempted to use energy content of a short segment of speech as a criterion for how to define the vector table. This implies that a certain fixed table is chosen based on the energy and number of vectors. This method was not successful because the energy associated with voiced speech varied over a large range.

The second method defines precisely the regions of a large table which are necessary to quantize all of the vectors contained over a certain interval of time. Although this method requires that bits be used for the table definition, it has been much more successful in adapting to the behavior of the waveform. This method has been implemented in the current prototype CPC. The following discussion gives some of the details of this method.

The interval of time for which the vector table is defined is 8 msec. (This is a parameter which can be changed.) The vector table is defined by specifying which of 32 possible regions of a large table are necessary to code the vectors contained in the 8 msec. Currently, the large table allows for one to eight time samples and amplitude values of 0 to 256. The range of the amplitude arises from two factors:

a. Since the default for the vector slope sign is alternating, those vectors which have negative amplitude components are assigned the same regions as the positive amplitude vectors.

b. Since the compression ratio being used is 8:1, the output of a 12-bit A/D converter is reduced from 2048 to 256.

A typical 8-msec segment of voiced speech requires about 7 to 10 out of the 32 possible regions to quantize the vectors. A typical segment of unvoiced speech requires only about 4 to 6 of these regions. The reason for this difference is obviously due to the higher variability of voiced speech vectors.

5.1.4 Bit Rate Stabilization

Due to the nature of CPC, the information to be transmitted is not generated at a uniform rate. In order to uniformize this rate, a delay has to be introduced during which information can be buffered. The details of how to do this were given in Section 4.4. This method is being used in the prototype CPC. Since the duration of the stabil-ization interval being used is 96 msec, a delay of less than one-tenth of a second is incurred. This delay is usually unobjectionable. During this stabilization period, statistics about the signal structure—number of vectors, number of nonsign changes in vector slopes, and number of quantization regions—are gathered which are used to compute the quantization stepsize for the vectors. This stepsize is calculated in such a way (see Section 4.3.2) that the bit rate for the entire stabilization interval will be fixed at 16 kbps, or whatever desired rate. Details of the bit stream format will be given in Section 5.3.

5.1.5 Signal Reconstruction

Two methods were presented in Section 4.5 to perform the interpolation process between critical points. They are (1) joining successive critical points with independent third order polynomials and (2) cubic splining. Although cubic splining results in a smoother reconstruction, it is computationally more costly since it involves solving a system of equations. The prototype CPC uses the first method because of simplicity and the fact that the majority of critical points occur at peaks and valleys in the waveform. This makes the zero derivative condition consistent with the structure of the original speech waveform at the critical points.

5.2 FORTRAN Implementation of Prototype CPC

The prototype CPC has been implemented in FORTRAN on a Digital Equipment PDP 11/34 minicomputer. This section will describe in detail the flow of this program and illustrate the manner in which the data is buffered.

5.2.1 Transmitter

Figure 21:
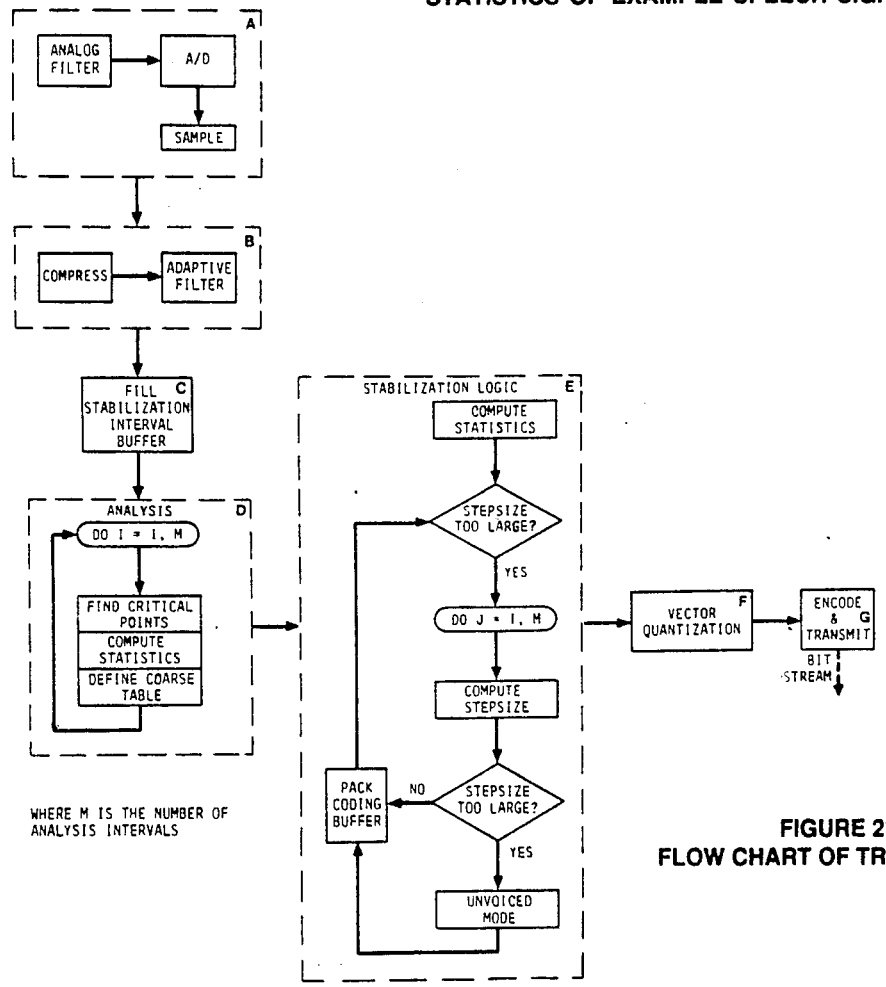
FIG. 21 is a flowchart of a transmitter.
Figure 22:
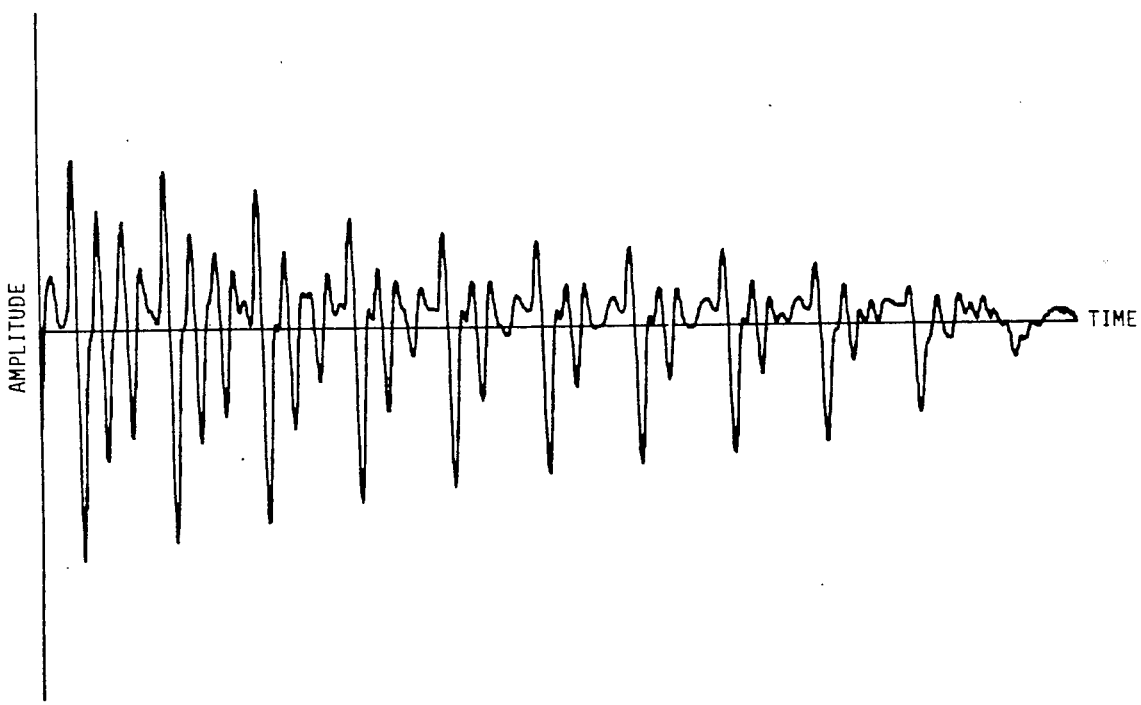
FIG. 22 is a graph showing an example of an input speech signal.
Figure 23:
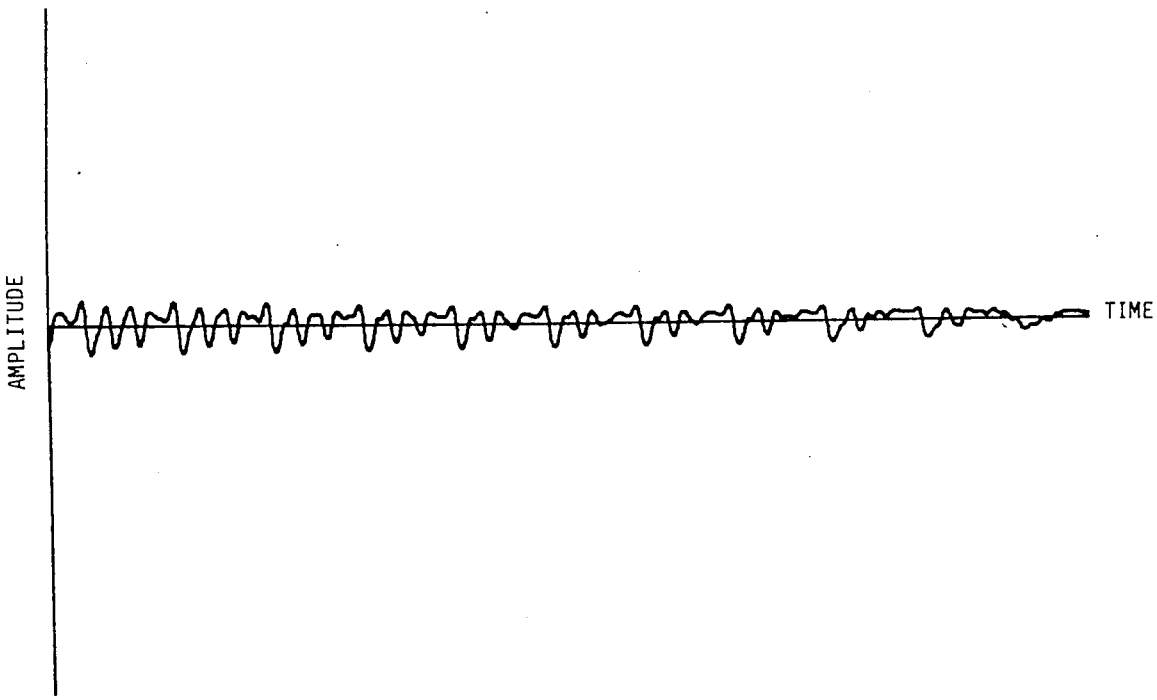
FIG. 23 is a graph showing output of a compressor and adaptive filter.

The description of the transmitter can best be illustrated using an example of actual speech and stepping through the flow chart shown in FIG. 21. The speech signal to be used as input is shown in FIG. 22. This represents 96 msec of digital data which have been filtered to 3.6 kHz by an analog filter prior to A/D conversion and then sampled at 16 kbps. This is illustrated in the block labeled A of the flow chart. The sampled data are then compressed by a nonlinear function and filtered adaptively according to the structure of the speech signal. This process is performed by block B of the flow chart; the signal output of this block is shown in FIG. 23.

Figure 24:
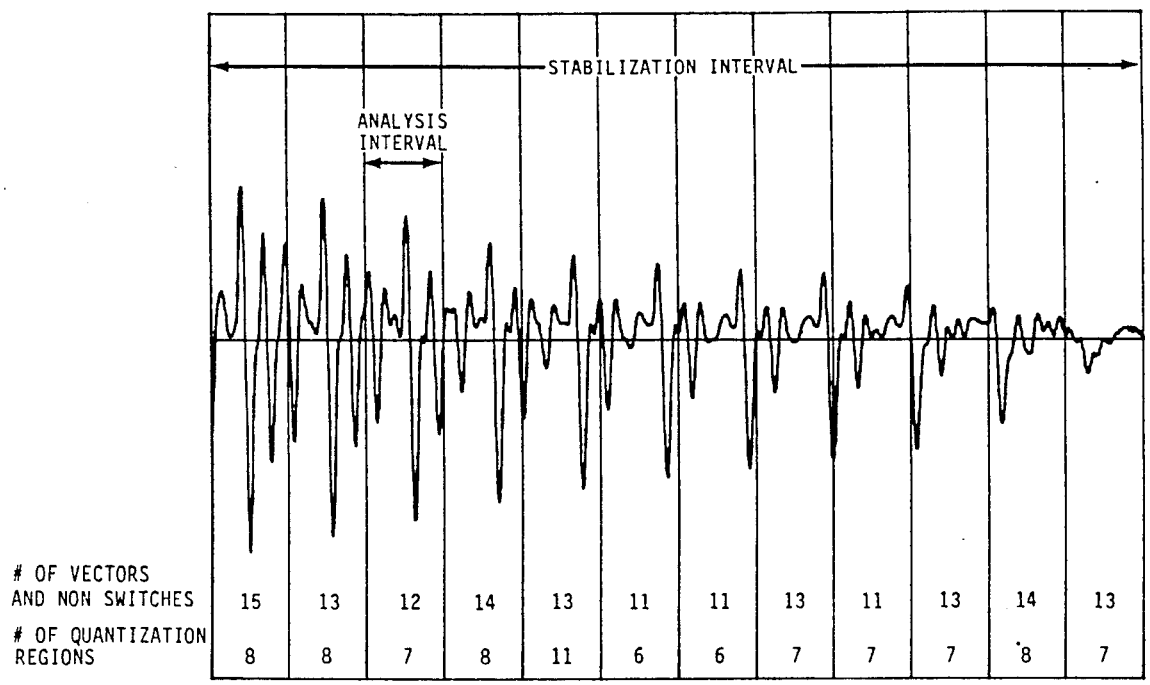
FIG. 24 is a graph showing statistics of an example speech signal.

A buffer consisting of 96 msec of speech is filled as shown in block C. This buffer is called the stabilization interval. It is this interval for which the bit rate is fixed at 16 kbps, or some other fixed desired rate. The next block labeled D performs analysis on this stabilized interval. For each of M analysis intervals it detects the critical points, computes statistics, and defines the coarse table. The statistics consist of the number of critical points; the number of nonswitches, or times when the slope does not change sign; and the number of regions of the quantization table required for the vectors. For the example being used, the number of analysis intervals is 12 and the statistics are shown in FIG. 24.

Once the statistics have been gathered, the logic which stabilizes the bit rate is performed. This logic is labeled block E in FIG. 21. The stabilization is achieved by calculating the quantization stepsize such that the number of bits required to code all the vectors is not exceeded. Sometimes, the stepsize becomes too large due to a large number of vectors. This usually occurs when there is a transition from voiced to unvoiced or vice versa during the stabilization interval or when the entire interval is unvoiced. In either of these cases, a large stepsize would result in serious degradation due to a large quantization error. Therefore, the following three modes exist for handling the data:

Mode 1: When the stepsize is below a certain threshold value, this stepsize is used to quantize all the vectors for the entire stabilization interval.

Mode 2: The stepsize for the particular analysis interval is calculated. If this stepsize is not too large, this stepsize is used for the vectors contained only for that analysis interval.

Mode 3: When the stepsize for the analysis interval is too large, coding is performed using the unvoiced mode described in section 4.4.1.

When the stepsize for the entire stabilization is too large, either a transition has occurred or the entire interval is unvoiced. When a transition has occurred, a combination of Modes 2 and 3 is used. When the entire interval is unvoiced, only Mode 3 is used.

No matter which of the three modes was used, the vectors are quantized in block F using the stepsize which was calculated. The bit stream is then formed and transmitted as shown in block G. The format of the bit stream will be described in section 5.3.

5.2.2 Receiver

Figure 25:
FIG. 25 is a block diagram of a receiver.

The receiver is much simpler than the transmitter since the transmitter has to perform the bit rate stabilization. A block diagram of the receiver is shown in FIG. 25. The receiver merely has to decode the bit stream, extract the vectors, expand them using the inverse of the compression function, and reconstruct the signal between the critical points using a cubic polynomial.

5.2.3 Program Parameters

To illustrate the versatility of this program, a printout of how the program is run for the signal in FIG. 22 is shown in under the heading "Program Output for Example Speech Signal". Several sections of this printout have been labeled and will be referred to in the following discussion. The file to be processed is input by the user at A. The user can specify where in the file the processing is to begin and end at B. Then the user is asked what parameter file he wants to use. This parameter file defines many of the variables which affect the way in which processing is performed. The following list describes each of these parameters shown at C:

IBTI: Input bit rate (bps)
IBTO: Output bit rate (bps)
LCNK: Time duration of stabilization interval (msec)
LSCK: Time duration of analysis interval (msec)
MAX1: Stepsize threshold for Mode 3
MAX2: Stepsize threshold for Modes 1 and 2
LMOD: Number of of bits to specify mode
LSTP: Number of bits to specify stepsize
LTBL: Number of bits to define quantization table
CMAX: Maximum amplitude prior to compression
CMIN: Maximum amplitude after compression
MAXX: Maximum time component of vectors
NTP1: Minimum number of taps for adaptive filter
NTP2: Intermediate number of taps for adaptive filter
NTP3: Maximum number of taps for adaptive filter
CSLP: Derivative of compression function at zero
FALP: Parameter used in adaptive filter
RMIN: Minimum $\rho$ used to define number of taps of filter
RMAX: Maximum $\rho$ used to define number of taps of filter For illustration, intermediate printouts are shown. The statistics which are computed during analysis are shown at D. They are given for each of the analysis intervals and for the total interval. The stepsizes for the stabilization and each of the analysis intervals are shown at E. For the example being used, a stepsize of 5.342936 was calculated in order to achieve a bit rate of 16 kbps. This meets the criterion of Mode 1, which is consistent with intuition because the signal is well-behaved voice speech.

5.3 Bit Stream Format

This section describes the format of the bit stream to be output by the transmitter. Since it is necessary to know how many bits are available for coding vectors, and thus to calculate stepsize, the following format has been developed.

Figure 26:
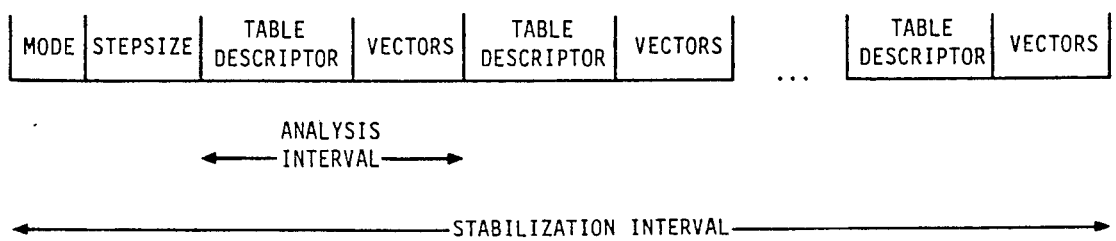
FIG. 26 shows a bit stream format for mode 1.
Figure 27:
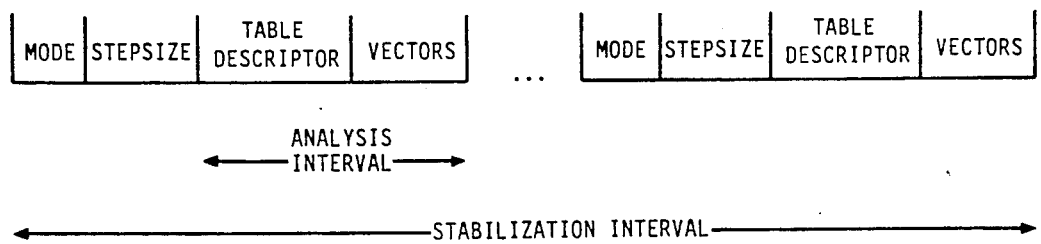
FIG. 27 shows a bit stream format for mode 2 and mode 3.

FIG. 26 illustrates the format of the bit stream for one stabilization interval using Mode 1. The mode word simply tells the receiver which of the three mode is being used and, therefore, how to expect the data. Since the stabilization interval is always a fixed period of time, the receiver will always know when to expect the mode word. This will require only two bits since there are only three possible modes. The stepsize follows the mode word. Depending on the maximum threshold stepsize for Mode 1, currently set at 32, this will not require more than 5 bits. The stepsize is followed by a table description word and the quantized vectors for each of the analysis intervals. Since the quantization table is defined by specifying which of 32 regions are required, the descriptor word requires 32 bits. This is followed by the sequence of quantized vectors. These vectors must also include a special vector which indicates the nonswitches and one vector which is a stop vector. The following example illustrates how the number of bits available for vector coding is calculated.

First, consider the bit stream for Mode 1. Assume that the stabilization interval is 96 msec long and the desired output rate is 16 kbps. This means that $96 \times 16 = 1536$ bits are available for coding. The 2 bits required for the mode word and say 5 bits for the stepsize must be subtracted from the total 1536 bits, leaving 1529 bits to code the analysis intervals. Suppose the duration of each analysis interval is 8 msec. This means there will be $96/8 = 12$ analysis intervals. For each of these analysis intervals, a 32-bit table descriptor word must be sent. This means that $12 \times 32 = 384$ bits are used for the table descriptors. And finally, a total of $1529 - 384 = 1145$ bits are left to code all the vectors in the stabilization inverval.

The bit stream format for Modes 2 and 3 is illustrated in FIG. 28. Since both Modes 2 and 3 can coexist in the same stabilization interval, the mode word must be transmitted for each of the analysis intervals. Also, since the stepsize is calculated for each analysis interval, this must also be transmitted. Mode 3 has the same format for each of the analysis intervals except that the receiver knows it is receiving only half the vectors and must interpolate the remainder as described in Section 4.4.1. Using similar calculations as Mode 1, the number of bits available for coding the vectors is 1068 with Mode 2 or 3.

---

PROGRAM OUTPUT FOR EXAMPLE SPEECH SIGNAL

RUN CPCBCF
ENTER NAME OF INPUT FILE
OP3:[100,101]JKNBN,1         ⎫
ENTER NAME OF OUTPUT FILE    ⎬  A
OP:4[100,24]CPCOUT,1         ⎭

PROGRAM OUTPUT FOR EXAMPLE SPEECH SIGNAL

```
ENTER INPUT STARTING BLOCK, SAMPLE  ⎫
60,1                                │
ENTER INPUT ENDING, SAMPLE          ⎬ B
65,256                              ⎭
ENTER OUTPUT STARTING BLOCK SAMPLE
1,1
ENTER OUTPUT ENDING BLOCK, SAMPLE
5,256
THE SUBROUTINE PARAM ASSUMES THERE WILL BE
15 INTERGER AND 4 REAL PARAMETERS
ENTER NAME OF PARAMETER FILE
DP4:[100,24]PARAM3.DAT
ARE YOU CREATING A NEW FILE (Y OR N)?
N
    IBTI= 16000   ⎫
    IBTO= 16000   │
    LCNK=    96   │
    LSCK=     8   │
    MAX1=    32   │
    MAX2=     8   │
    LMOD=     2   │
    LSTP=     5   │
    LTBL=    32   │
    CMAX= 2048    ⎬ C
    CMIN=  256    │
    MAXX=   16    │
    NTP1=    3    │
    NTP2=    4    │
    NTP3=    5    │
    CSLP= 0,500   │
    FALP= 0,900   │
    RMIN=10,000   │
    RMAX=20,000   ⎭
DO YOU WANT TO CHANGE A PARAMETER (Y OR N)?
N
# OF SUB-CHUNKS PER CHUNK:        12
# OF SAMPLES PER CHUNK          1536
# OF SAMPLES PER SUB-CHUNK       128
*** STOP FLAG SET ***
BLOCK NUMBER                      66
*** END OF CHUNK - PRINT OUT CURRENT STATISTICS ***
```

| # OF VECTORS PER SUB-CHUNK | | | | | | | | | | | |
|---|---|---|---|---|---|---|---|---|---|---|---|
| 12 | 10 | 12 | 14 | 12 | 10 | 10 | 11 | 11 | 11 | 12 | 12 |
| # OF NON-SWITCHES PER SUB-CHUNK | | | | | | | | | | | |
| 3 | 3 | 0 | 0 | 1 | 1 | 1 | 2 | 0 | 2 | 2 | 1 |
| # OF VECTORS AND NON-NON-SWITCHES PER SUB-CHUNK | | | | | | | | | | | |
| 15 | 13 | 12 | 14 | 13 | 11 | 11 | 13 | 11 | 13 | 14 | 13 |
| # OF QUANTIZATION REGIONS PER SUB-CHUNK | | | | | | | | | | | |
| 8 | 8 | 7 | 8 | 11 | 6 | 6 | 7 | 7 | 7 | 8 | 7 |

(Group D)

```
TOTAL VECTORS AND NON-SWITCHES PER CHUNK:    153
TOTAL QUANTIZATION REGIONS FOR CHUNK:         90
STEPSIZE FOR ENTIRE CHUNK=    5.342936   5,565217
# OF BITS REQUIRED TO CODE VECTORS=  1145.000  1136.003  ⎫
STEPSIZE FOR EACH SUB-CHUNK:                             │
   16.00000    8.43813   4.94975  11.88795  11.60242  2.64477  ⎬ E
    2.64477    7.38336   3.08557   7.38336  11.88795  7.38336  ⎭
TOTAL NUMBERS OF VECTORS:         137
TOTAL NUMBER OF NON-SWITCHES:      16
TT) -- STOP
```

7.0 SUMMARY

There has been described a prototype Critical Point Coder which performs the following:

a. Detects critical point in an optimal way.

b. Achieves a 16 kilobit per second rate by reducing the number and variability of critical points without seriously degrading the speech quality.

c. Uses a bit allocation scheme which adapts to the waveform structure.

d. Stabilizes the non-uniform bit rate by using variable quantization stepsizes.

e. Reconstructs the signal using a simple interpolation function.

It is understood that certain modifications to the invention as described may be made, as might occur to one with skill in the field of this invention, within the scope of the appended claims. Therefore, all embodiments contemplated hereunder which achieve the objects of the present invention have not been shown in complete detail. Other embodiments may be developed without departing from the spirit of this invention or from the scope of the appended claims.

What is claimed is:

1. Signal processing apparatus using critical point coding comprising a transmitter and a receiver, which are interconnected via data transmission means for digitally encoded signals, the transmitter having an input from a voice signal source, and the receiver having a voice-signal output;

wherein the transmitter and receiver have corresponding vector tables, each defining precisely 32 regions which are necessary to quantize all of the vectors contained over a certain interval of time, designated an analysis interval which is equal to eight milliseconds, including bits for the table definition, with the table allowing for one to eight time samples and amplitude values of 0 to 256, to the range of the amplitude arising from two factors, (1) since the default for the vector slope sign is alternating, those vectors which have negative amplitude components are assigned the same regions as the positive amplitude vectors, and (2) with a compression ratio being used of 8:1, the output of a 12-bit A/D converter is reduced from 2048 to 256; whereby a typical 8-msec segment of voiced speech requires about 7 to 10 out of the 32 possible regions to quantize the vectors, and a typical segment of unvoiced speech requires only about 4 to 6 of these regions;

wherein the transmitter comprises:

(a) an analog filter having an upper cutoff frequency of about 3.6 kilohertz, said A/D converter, and sample means coupled in sequence from said voice signal source, to produce digital signals sampled at 16 kilobits per second using 12 bits per sample;

(b) compression means followed by adaptive filter means, with an input of the compression means coupled to said sample means, for compressing the data from the sample means sample-by-sample with a given compression function, for providing said compression ratio, and filtering adaptively according to the structure of the voice signal;

(c) buffer means coupled to the adaptive filter means for storing of digital samples of voice signals during each of successive stabilization intervals equal to 96 millseconds;

(d) analysis means for analyzing signals from the buffer means during each stabilization interval, with means for dividing each stabilization interval into twelve analysis intervals, and for each analysis interval finding those points in the waveform where it is changing direction most rapidly, these being the critical points, computing statistics, and defining a course table, the statistics being the number of critical points, the number of nonswitches (times when the vector slope does not change sign), and the number of regions of the vector table required for the vectors;

(e) logic means coupled to said analysis means for stabilizing the bit rate by calculating quantization stepsizes such that the number of bits required to code all the vectors is not exceeded, the logic means being effective during each stabilization interval to gather statistics about the signal structure, including the number of vectors, number of nonsign changes in vector slopes, and number of quantization regions, which are used to compute the quantization stepsize for the vectors, the stepsize being calculated in such a way that the bit rate for the entire stabilization interval is fixed at a given rate; with there being three modes for handling the data, a first mode for when the stepsize is below a certain threshold value, with this stepsize being used to quantize all the vectors for the entire stabilization interval, a second mode for calculating the stepsize for the particular analysis interval, this stepsize being used for the vectors contained only for that analysis interval, and a third mode for use when the stepsize for the analysis interval is too large, coding being performed using an unvoiced mode;

(f) vector quantization means for quantizing the vectors using the stepsize calculated by said logic means (e);

(g) encoding means coupled to the vector quantization means for encoding the quantized vectors for each stabilization interval in a digit code using a format comprising a mode word defining which of said modes is being used, a stepsize word, and for each analysis interval, a table descriptor word followed by a sequence of the quantized vectors, including a special vector which indicates nonswitches and one vector which is a stop vector, with the first mode having only one mode word and stepsize word for the entire stabilization interval, and the second and third modes having a mode word and stepsize word for each analysis interval during the stabilization interval, and means for transmitting the resulting code via the data transmission means;

wherein the receiver comprises decode means coupled to receive signals from the data transmission means and to decode the bit stream, extraction means coupled to the decode means to extract the vectors, expansion means coupled to the extraction means to expand the vectors using the inverse of the compression function, and reconstruction means coupled between the expansion means and the voice-signal output using an interpolation function to construct the waveform between the critical points.

2. Signal processing according to claim 1, wherein the reconstruction means provides the properties that the interpolating function is monotonic between critical points, and for voiced speech the interpolating functions join smoothly between points.

3. Signal processing according to claim 2, wherein the number of entries in the vector tables is limited by replacing large vectors by a sum of at least two smaller vectors, limiting the time coordinates of vectors to a predetermined maximum and the amplitude to one-half of the total dynamic range.

4. Signal processing according to claim 1, wherein the reconstruction means provides the properties that the interpolating function is monotonic between critical points, and for voiced speech the interpolating functions join smoothly between points; and wherein the number of entries in the vector tables is limited by replacing large vectors by a sum of at least two smaller vectors, limiting the time coordinates of vectors to a maximum of two milliseconds and the amplitude to one-half of the total dynamic range.

* * * * *